(12) United States Patent
Taniguchi

(10) Patent No.: US 6,312,859 B1
(45) Date of Patent: *Nov. 6, 2001

(54) PROJECTION EXPOSURE METHOD WITH CORRECTIONS FOR IMAGE DISPLACEMENT

(75) Inventor: Tetsuo Taniguchi, Yokohama (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/263,803

(22) Filed: Mar. 8, 1999

Related U.S. Application Data

(63) Continuation of application No. 08/871,881, filed on Jun. 9, 1997, now abandoned.

(30) Foreign Application Priority Data

Jun. 20, 1996 (JP) .................................................... 8-159718
Aug. 22, 1996 (JP) .................................................... 8-239714

(51) Int. Cl.$^7$ ........................................................ G03F 9/00
(52) U.S. Cl. .............................................. 430/22; 430/30
(58) Field of Search ......................................... 430/22, 30

(56) References Cited

U.S. PATENT DOCUMENTS 5,117,255   5/1992   Shiraishi et al. ........................ 355/53
5,569,570   10/1996   Balzer .................................... 430/22

*Primary Examiner*—Christopher G. Young
(74) *Attorney, Agent, or Firm*—Nixon & Vanderhye P.C.

(57) ABSTRACT

An imagery characteristic is corrected by changing the position and/or orientation of a reticle or lens elements of a projection lens system. Correction of the imagery characteristic, however, causes displacement of the projected pattern image of the reticle. The relation between the driving amount of the lens elements and reticle and the lateral displacement of the center of the pattern image of the reticle is stored as a table in advance. When the lens elements and/or the reticle are driven, lateral displacement of the pattern image can be obtained by accessing the table. Alternatively, the lateral displacement can be determined using a base-line amount corresponding to a distance between a detection center of a substrate position detector and a center of the projected image. Once the pattern image displacement is determined, the substrate can be accurately positioned. In another arrangement, a mask alignment method prevents positional shift of a projected image of a mask pattern even if the projection magnification of the projection optical system is changed.

31 Claims, 7 Drawing Sheets

PROJECTION EXPOSURE METHOD WITH CORRECTIONS FOR IMAGE DISPLACEMENT

This is a continuation of application Ser. No. 08/871,881, filed Jun. 9, 1997, now abandoned.

BACKGROUND OF THE INVENTION

This invention relates to a projection exposure apparatus used for exposing a pattern on a mask onto a photosensitive substrate in a photolithographic process for manufacturing a semiconductor device, liquid crystal display device, image pick-up device (CCD), thin-film magnetic head, and the like, and more particularly to a projection exposure apparatus having a mechanism for correcting the imagery characteristic of the projection lens system.

For manufacturing a semiconductor device or the like, a projection exposure apparatus is generally used, which transfers a pattern image formed on a reticle (serving as a mask) onto a wafer (or glass plate) as a photosensitive substrate through a projection lens system. Conventionally, an exposure apparatus of a collective exposure type, such as a stepper, has been used. However, a so-called step-and-scan type projection exposure apparatus has been recently substituted for the collective exposure type projection exposure apparatus. The step-and-scan type exposure apparatus exposes a pattern image onto a shot area on the wafer, while scanning both the reticle and wafer with respect to the projection lens system.

The projection lens system used in a projection exposure apparatus requires high resolution over substantially the entire exposure area, because the circuit pattern of the reticle must be precisely transferred onto the wafer. To this end, measures have been proposed to correct aberration in the projection lens system in every stage of the design and manufacturing processes. However, because the imagery characteristic of the projection lens system easily varies in response to the changes in atmospheric pressure, environmental temperature, absorption of illumination, etc., merely satisfying a certain imagery characteristic under a specific environmental condition is insufficient in practical use.

Recent projection exposure apparatus are equipped with an imagery characteristic correction mechanism, which measures the fluctuation in parameters of environmental conditions to calculate the changing amount of the imagery characteristic, or alternatively, directly measures the changing amount of the imagery characteristic and corrects the imagery characteristic of the projection lens system. The imagery characteristic of the projection lens system may be intentionally changed so that the apparatus matches with the characteristics of other projection exposure apparatus or photosensitizers.

Examples of the technique for correcting the imagery characteristic using an imagery characteristic correction mechanism include a method for driving the optical elements (lenses) in the projection lens system or the reticle along the optical axis of the projection lens system to correct the projection magnification, isotropic distortion (barrel distortion), spherical distortion, image plane distortion, etc. Another technique is to tilt the lens element of the projection lens system or the reticle with respect to a plane perpendicular to the optical axis of the projection lens system to correct anisotropic distortion (trapezoidal distortion) and image plane inclination. Still another technique is to seal the gap between certain lenses of the projection lens system and change the internal pressure of the sealed space to adjust the refractive index of the internal air to correct the projection magnification, isotropic distortion (barrel distortion), spherical aberration and image plane distortion.

When using such a conventional imagery characteristic correction mechanism, the imagery characteristic of the projection optical system is appropriately corrected; however, unintended positional shifts of the image-forming position may occur. This is because when driving the driven object (particularly lenses within the projection lens system, or the reticle) along the optical axis of the projection lens system, the driven object often slightly slips out of the optical axis and advances obliquely because it is difficult to drive the lens or reticle strictly parallel to the optical axis. Generally, when driving the lens or reticle in the optical-axis direction, the position of the lens or the reticle is strictly controlled by, for example, a position sensor. On the contrary, with respect to the direction perpendicular to the optical axis, the movement of the driven object is simply guided by a guide mechanism because it is typically not necessary to control the movement of the lens in the direction perpendicular to the optical axis. However, slackness (vibration) or elastic deformation of the guide mechanism may cause the driven object to move slightly out of line with the optical axis, which may result in displacement of the image-forming position of the pattern image off the optical axis.

During a semiconductor manufacturing process, multiple layers of different circuit patterns are exposed onto the wafer. Each pattern must be precisely superimposed on the previous pattern formed through the previous exposure. The projection exposure apparatus generally has an alignment sensor for detecting a registration mark formed on the previous pattern to determine a proper exposure position. Examples of the alignment sensor include a TTR (through-the-reticle) sensor, which monitors both the alignment mark on the reticle (referred to as a reticle mark) and the alignment mark on the wafer (referred to as a wafer mark) simultaneously. While a TTR sensor is very precise, there are several limitations in its operation because of the simultaneous measurement of the reticle and the wafer. To this end, an off-axis method is often used, in which only the wafer mark is detected using an alignment sensor fixed to the side of the projection lens system. In the off-axis method, the positional relation (base-line amount) between the reticle mark (more precisely, the center of the projected pattern image of the reticle) and the detection center of the alignment sensor is obtained and stored in advance. When the alignment sensor detects the position of the wafer mark, displacement of the wafer during exposure is then determined based on the detection result of the sensor and the prestored positional relation.

When exposing multi-layers of circuit patterns on the photosensitive substrate, the mark formed on the photosensitive substrate is aligned with the mark-detection optical system. The substrate stage is then moved from this position by the base-line amount to execute exposure. In this manner, the reticle pattern image is aligned with the circuit pattern, which has already been formed on the photosensitive substrate.

In a conventional projection exposure apparatus, the positional relationship between the image position of the reticle mark projected on the substrate stage and the detection center of the mark-detection optical system must be accurately detected. The absolute position of the reticle in a projection exposure apparatus is not so strictly regulated, as long as the reticle position relative to the photosensitive substrate is precisely controlled. For example, the reticle position relative to the projection optical system is not strictly controlled as long as the reticle is positioned within the exposure area and the precision of the projection optical system is assured in that area. A projection optical system is generally composed of a plurality of (e.g., twenty or more) lens elements. The optical axis of the projection optical system is defined by a composition of offset components of the center axes of the respective lens elements. It is not defined by the outer diameter of the projection optical system or the positions of the lens elements. If the area of reticle positions relative to the projection optical system is too large, the exposure area of the projection optical system must also be set large, which increases the cost.

In view of the circumstance described above, the position of the reticle is conventionally adjusted with reference to the outer diameter of the lens barrel of the projection optical system at a mechanical precision of about 200–400 $\mu$m.

If the image-forming point changes through driving the imagery characteristic correction mechanism after the relation between the reticle mark and alignment sensor has been stored, then the wafer position slips out of the proper position, which causes an alignment error in superimposing pattern layers.

Occurrence of an alignment error is not limited to the case in which the lens element(s) or reticle are driven along the optical axis. For example, in the method in which the gap between the lens elements in the projection lens system is sealed to change the internal pressure to adjust the refractive index, the retainer supporting the lens elements may elastically deform due to the internal pressure, which causes the lens element to slightly move on or out of the optical axis. If the lens element moves in the direction perpendicular to the optical axis, the image-forming position would slip out of the proper position.

In addition to such unintended change in the image-forming position as described above, there is also implicit error in the system. For example, when the driven object is tilted with respect to a plane perpendicular to the optical axis of the projection lens system, anisotropic distortion may change, and at the same time, the entire image may shift. If, after distortion is corrected by tilting the driven object, the driven object is further driven along the optical axis to correct the isotropic distortion, then the image-forming position slightly changes even if the driven object is moved precisely along the optical-axis direction, because the driven object is already tilted.

Thus, when the imagery characteristic is corrected by driving the imagery characteristic correction mechanism, the image-forming position changes due to the imperfection of the driving mechanism, resulting in alignment errors.

Moreover, as the circuit patterns become smaller and more detailed, the requirement for alignment precision becomes stricter. To this end, in a recent technique, the magnification of the projection optical system is adjusted to correct the distortion of the photosensitive substrate. The position of the detection mark on the photosensitive substrate is detected to determine an amount of expansion (or contraction) of the photosensitive substrate. The magnification of the projection optical system is adjusted to the optimum value taking into consideration the expansion (or contraction) of the photosensitive substrate, so that exposure is performed under the optimum magnification, correcting the thermal distortion of the photosensitive substrate due to the high-temperature process.

When the magnification of the projection optical system is slightly changed through magnification adjustment, however, the center of the reticle pattern image also slightly shifts because the center of the reticle is not in precise alignment with the optical axis of the projection optical system in the conventional apparatus. When the reticle center is not coincident with the optical axis of the projection optical system, it is also offset from the alignment sensor within the projection exposure apparatus. Even though the magnification is set to the optimum state through the adjustment operation, the pattern image, which is to be superimposed onto the previous circuit pattern layer on the substrate, shifts as a whole.

As shown in FIG. 8, the center RCT of the reticle pattern image is offset from the optical axis AX of the projection optical system (in the effective area 201). In this example, the projection magnification is adjusted according to expansion of the photosensitive substrate, and the initial reticle image 202 is enlarged to the reticle image 203. The reticle image expands apart from the optical axis AX, which is a fixed reference axis, in proportion to the magnification. The vertices of the reticle image move outward along the dashed lines 204, 205 and 206, and the center RCT of the reticle image also slightly moves along the dashed line 204 because the center RCT of the reticle image is initially offset from the optical axis. This positional shift results in an alignment error.

When the position of the reticle is adjusted mechanically with reference to the outer diameter of the projection optical system, the center of the reticle pattern image generally shifts about 200–400 $\mu$m from the optical center axis. If the magnification is changed by 20 ppm in this state, the center of the reticle pattern image shifts 4–8 nm. Alignment accuracy in recent projection exposure apparatus requires that the error be within 100 nm. Considering various other factors of alignment errors, such as imagery characteristic (mainly distortion) of the projection optical system, variation in the base-line amount, fluctuation in the stage control accuracy, or measurement error in the alignment sensor (mark detection optical system), it is not acceptable that the error caused by magnification adjustment occupies almost one tenth of the entire acceptable error range.

As a magnification adjusting mechanism, a mechanism for driving a part of the lens elements of the projection optical system along the optical axis is known. It is very difficult, however, to accurately drive the lens elements along the optical axis. A lens element slightly slips out of alignment with the optical axis in the direction perpendicular to the optical axis, or tilts with respect to the optical axis, which causes the reticle pattern image to shift. In this situation, positional shift of the reticle pattern image due to offset of the lens elements is further added to the divergence due to offset of the reticle pattern image center from the optical center axis, and the alignment error caused by magnification adjustment becomes still worse.

SUMMARY OF THE INVENTION

This invention aims to provide a projection exposure apparatus having an imagery characteristic correction mechanism that corrects the imagery characteristic of the projection lens system and is capable of suppressing occurrence of an alignment error in superimposing pattern layers even if the imagery characteristic correction mechanism is driven.

These and other objects of the invention are achieved by providing a projection exposure apparatus for projecting a pattern image formed on a mask onto a photosensitive substrate though a projection optical system to form a projected image thereon. The projection exposure apparatus includes a substrate position detector that detects a position of a registration mark formed on the substrate, an imagery characteristic correction mechanism coupled with the projection optical system that drives the projection optical system to correct an imagery characteristic of the projection optical system, an image-forming displacement detector communicating with the imagery characteristic correction mechanism that determines a displacement amount of an image-forming position of the projected image formed through the projection optical system in accordance with a driven amount of the projection optical system by the imagery characteristic correction mechanism, and an alignment signal processor communicating with the substrate position detector and the image forming displacement detector, wherein the alignment signal processor corrects the detection result of the substrate position detector based on the displacement amount of the image-forming position obtained by the image-forming displacement detector.

The imagery characteristic of the projection lens can be corrected by the imagery characteristic correction mechanism. The image-forming position of a projected image formed through the projection optical system may be displaced by driving the imagery characteristic correction mechanism, which displacement can be detected by the image-forming displacement detector. The displacement amount detected by the image-forming displacement detector is used by the alignment signal processor to correct the detection result of the substrate position detector. With this structure, even if the image-forming position is displaced by driving the imagery characteristic correction mechanism, the displacement does not result in an alignment error in superimposing pattern layers.

The image-forming displacement detector preferably accesses a memory storing the relation between the driving amount of the projection optical system by the imagery characteristic correction mechanism and the displacement of the image-forming position of the projected image formed through the projection lens. When the imagery characteristic correction mechanism is driven, and the image-forming position changes as a result, displacement of the image-forming position is instantaneously detected based on the prestored relation. The displacement can be automatically corrected based on the prestored relation.

The imagery characteristic correction mechanism preferably includes a driving device coupled with one or more optical elements of the projection lens system and/or the mask to drive the optical elements or the mask along the optical axis, or, alternatively, with respect to a plane perpendicular to the optical axis.

The imagery characteristic correction mechanism may alternatively control a gas pressure adjustment mechanism for changing the internal pressure within the sealed space between the lens elements of the projection lens system.

In another aspect of the invention, an exposure apparatus projects a transfer pattern image formed on a mask through a projection lens system onto a photosensitive substrate to form a projected pattern image thereon. The projection exposure apparatus includes a substrate position detector that detects a position of the registration mark on the substrate, an imagery characteristic correction mechanism coupled with the projection optical system that drives the projection optical system to correct an imagery characteristic of the projection optical system, a base-line amount measuring device that measures a distance between a detection center of the substrate position detector and a center of the projected image formed through the projection optical system, the distance defining a base-line amount, and an alignment signal processor communicating with the substrate position detector and the base-line amount measuring device that corrects the detection result of the substrate position detector based on the base-line amount.

The imagery characteristic of the projection lens system is corrected by the imagery characteristic correction mechanism. The position of the mask pattern image may be displaced when the imagery characteristic is corrected, and the displacement is reflected in variations in the base-line amount. The base-line amount can be measured again by the base-line amount measuring mechanism after the base-line amount has changed, and the detection result of the substrate position detector is corrected based on the remeasured base-line amount. Thus, even if the image-forming position is laterally displaced by driving the imagery characteristic correction mechanism, alignment errors can be suppressed in superimposing pattern layers.

In accordance with still another aspect of the invention, there is provided a method of projecting a pattern image formed on a mask onto a photosensitive substrate through a projection optical system to form a projected image thereon. The method includes the steps of (a) detecting with a substrate position detector a position of a registration mark formed on the substrate, (b) driving the projection optical system to correct an imagery characteristic of the projection optical system, (c) determining a displacement amount of an image-forming position of the projected image formed through the projection optical system in accordance with a driven amount of the projection optical system in step (a), and (d) correcting the detected position from step (a) based on the displacement amount.

In accordance with yet another aspect of the invention, there is provided a mask alignment method for aligning a mask with respect to a projection optical system having an optical axis prior to transferring a pattern image of the mask onto a photosensitive substrate through the projection optical system. According to the method positions of projected images of at least two alignment marks formed on the mask are detected, with the alignment marks having a predetermined positional relationship with the pattern image. A magnification of the projection optical system is changed, and the positions of the projected images are detected again. The mask position is adjusted based on the positions of the projected images determined before and after magnification.

BRIEF DESCRIPTION OF THE DRAWINGS

These and other aspects and advantages of the present invention will be described in detail with reference to the accompanying drawings, in which.

DETAILED DESCRIPTION OF PREFERRED EMBODIMENTS

The projection exposure apparatus according to a first embodiment of the invention will be described. In this embodiment, the invention is applied to a stepper type projection exposure apparatus for collectively exposing a reticle pattern onto each shot area on the wafer.

Figure 1:
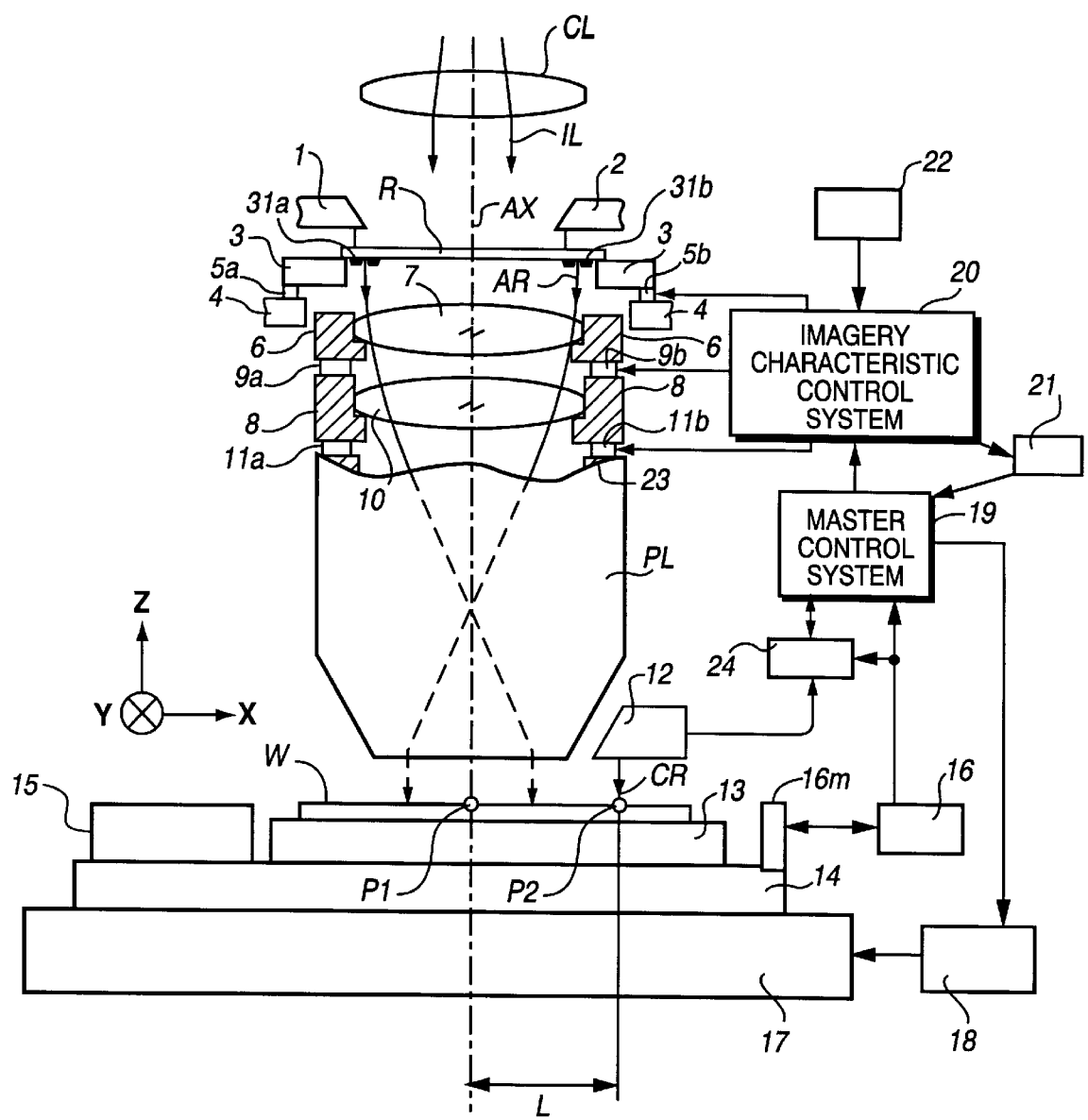
FIG. 1 is a partially cutaway view of the projection exposure apparatus according to one embodiment of the invention.

FIG. 1 shows the structure of the projection exposure apparatus of the present invention, a part of which is illustrated in cross-section. During exposure, illumination light IL is emitted from the main body of the illumination optical system (not shown) including a light source, a fly-eye lens and a field stop. The illumination light IL illuminates a reticle R, on which a circuit pattern is formed, with uniform illuminance distribution through a condenser lens CL. The circuit pattern image of the reticle R is projected and exposed through a projection lens system PL onto each shot area of the wafer W, which is coated with photoresist. Examples of the illumination light IL include bright-light (g-line, i-line) of ultraviolet band of super high-pressure mercury-vapor lamp, ArF excimer laser beam, KrF excimer laser beam, high harmonic wave of copper-vapor laser or YAG laser, etc.

The operation will now be explained based on the coordinate system with the Z axis parallel to the optical axis AX of the projection lens system PL, the X axis perpendicular to the Z axis and parallel to the paper of FIG. 1, and the Y axis vertical to the paper of FIG. 1.

The reticle R is held on a reticle holder 3 through known vacuum adsorption. The reticle holder 3 is mounted on a reticle stage 4 through three elastic driving elements, although only two driving elements 5a, 5b are shown in FIG. 1. Details of the driving elements 5a, 5b will be described below. Cross-shaped reticle alignment marks 31a, 31b for the X axis are provided on both ends of the reticle R along the X axis. Reticle alignment microscopes 1, 2 are positioned above the reticle R to observe the alignment marks 31a, 31b and measure the base-line amount, which is the distance that the center of the pattern image of the reticle R is from the measurement center of an alignment sensor 12. Measurement of the base-line amount will be described below in more detail.

The wafer W is supported on a wafer holder 13 through known vacuum adsorption, and the wafer holder 13 is fixed onto the Z-tilt stage 14 driven in the Z-axis direction along the optical axis AX of the projection lens system by an internal driving system. The Z-tilt stage 14 is designed so that it can rotate about the optical axis AX and incline with respect to a plane perpendicular to the optical axis AX. The Z-tilt stage 14 is mounted on the XY stage 17, which freely moves in the X and Y directions via a wafer stage driving system 18. With this structure, the wafer W is driven in the X and Y directions by the XY stage 17, and exposed by the step-and-repeat method. The wafer holder 13, Z-tilt stage 14 and XY stage 17 compose a wafer stage.

The XY coordinates of the Z-tilt stage 14 are accurately measured by a movable mirror 16 m fixed to the end of the Z-tilt stage, and an internal laser interferometer 16. The measured value of the laser interferometer 16 is supplied is to a master control system 19. The master control system 19 controls the position of the XY stage 17 through the wafer stage driving system 18 based on the measured value. A registration wafer mark (not shown) is provided in each shot area on the wafer W. The aforementioned structure is particularly suited for a stepper type projection exposure apparatus. If the structure is applied to a step-and-scan type projection exposure apparatus in which the reticle R and the wafer W are scanned relative to each other, a scanning mechanism is also provided on the reticle stage 4.

A reference plate 15 is provided on a part of the Z-tilt stage 14 so that the height of the surface of the reference plate 15 aligns with the height of the surface of the wafer W. Cross-shaped reference marks 40, 41, 42 (FIG. 3) are formed on the reference plate 15. The positional relation of the reference marks 40, 41, 42 is accurately measured in advance. When the base-line amount is measured by detecting the center of the pattern image of the reticle R (i.e., the pattern center), a part of the reference plate 15 is moved into the exposure field of the projection lens system PL.

Although it is not shown in the figure, the projection lens system PL s further has, on both sides thereof, an oblique incident type focal point detection system comprising a light-supply system and a light-receiving system for detecting the position of the wafer W in the Z-axis direction. The data about the height (vertical position) of the wafer W obtained by the focal point detection system is supplied to the master control system 19, which then controls the vertical position and inclination angle of the Z-tilt stage 14.

The projection exposure apparatus has an imagery characteristic correction mechanism for correcting the imagery characteristic of the projection lens system PL. The imagery characteristic correction mechanism comprises a reticle driving system for moving the reticle R and another driving system for moving a part of the lens elements making up the projection lens system PL. The reticle driving system is composed of three elastic driving elements (only the two driving elements 5a, 5b are shown in FIG. 1) fixed between the reticle holder 3 and the reticle stage 4. The driving elements 5a and 5b are preferably electrostriction elements, such as piezoelectric elements. The driving elements 5a, 5b expand or contract the same amount in response to a command from the imagery characteristic correction system 20, and drive the reticle R in the direction of the optical axis AX, to change the length of the optical path between the projection lens system PL and the reticle R, thereby correcting the projection magnification or distortion of the projection lens system PL.

Another driving system is positioned within the projection lens system PL. Among the lens elements composing the projection lens system PL, lens element 7 positioned closest to the reticle R and lens element 10 positioned directly below the lens element 7 are held by the lens holders 6 and 8, respectively. The lens holder 6 is supported on the lens holder 8 through three elastic driving elements 9a, 9b (two shown). The lens holder 8 is supported on the lens barrel 23 of the projection lens system PL through three elastic driving elements 11a, 11b (two shown). Similar to the reticle driving elements 5a, 5b, electrostriction elements, such as piezoelectric elements, are preferably used for the driving elements 9a, 9b, 11a, 11b. For example, when the driving elements 9a, 9b are expanded or contracted simultaneously parallel to each other, the lens element 7 is moved in the direction of the optical axis AX, thereby adjusting the distance between the lens elements 7 and 10. When the driving elements 9a, 9b are expanded or contracted independently, the tilting angle made by the lens element 7 and the plane perpendicular to the optical axis AX is adjusted. Similarly, by expanding or contracting the driving elements 11a, 11b equally, or independently, the Z-axis position of the lens element 10 and the tilting angle between the lens element 10 and the horizontal plane can be adjusted.

Figure 2:
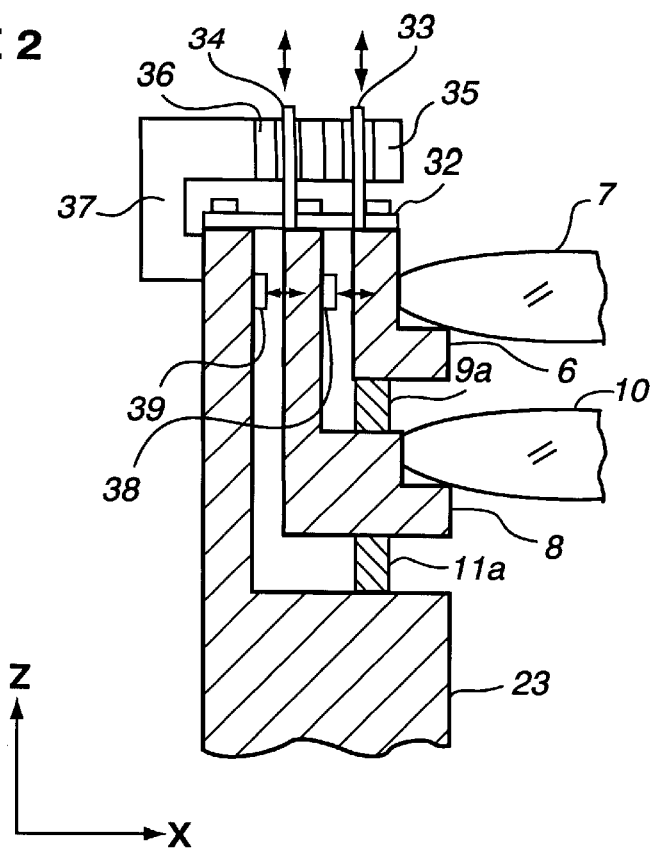
FIG. 2 is an enlarged cross-sectional view of the imagery characteristic correction mechanism in the projection exposure apparatus of FIG. 1.

FIG. 2 shows the detailed structure around the driving elements 9a, 11a. Each of the lens holder 6 supporting the lens element 7, the lens holder 8 supporting the lens element 10, and the lens barrel 23 has a side wall extending upward along the outer periphery and is fixed to the leaf spring 32 through fixing bolts at the top of the side wall. With this structure, the lens holders 6 and 8 can move in the direction along the optical axis AX, but hardly move in the direction perpendicular to the optical axis AX. In actual use, however, the lens elements 7, 10 may slightly move laterally due to elastic distortion of the leaf spring 32 when, for example, the lens elements 7, 10 are tilted. The lateral displacement causes the projected image to move in the lateral direction.

To accurately control the driving amount of the driving elements 9a and 11a in the optical axis direction, displacement detectors 35, 36 composed of an optical type linear encoder are provided above the leaf spring 32 through the support member 37 fixed to the lens barrel 23. The displacement detectors 35, 36 measure the displacement of the lens holders 6, 8 relative to the lens barrel 23 in the Z direction. Furthermore, an optical scale 33 is fixed to the leaf spring 32 at the position directly above the top surface of the lens holder 6 so as to extend along the displacement detector 35, while a second optical scale 34 is fixed to the leaf spring 32 at the position directly above the top surface of the lens holder 8 so as to extend along the displacement detector 36. The displacement of the optical scale 33 and the displacement of the optical scale 34 caused by the movement of the lens holders 6 and 8, respectively, in the Z direction are measured by the displacement detectors 35 and 36, respectively. Based on the measured values, the driving amount of the driving elements 9a, 11a is controlled. Each of the three driving elements positioned around the lens elements 7, 10 has similar structure.

Thus, the driving mechanism within the projection lens system PL adjusts the distance between the lens elements 7 and 10, adjusts the position along the optical axis, and adjusts the tilting angle to correct the magnification, distortion, image plane distortion, image plane inclination, or astigmatic distortion in the projection lens system. The driving elements 9a, 9b, 11a, 11b within the projection lens system PL are controlled by the imagery characteristic control system 20, similar to the reticle driving elements 5a, 5b. The imagery characteristic control system 20 receives various data from the master control system 19, including illumination conditions (aperture number of the illumination light, illumination method, such as zonal illumination, etc.) for the reticle R and incident energy of the illumination light into the projection lens system PL. The imagery characteristic control system 20 also receives environmental data, such as the temperature and atmospheric pressure, from an environmental sensor 22 positioned near the projection lens system PL. The imagery characteristic control system 20 estimates the fluctuation in the imagery characteristic of the projection lens system PL based on the supplied information, and controls the driving amount (expansion and contraction) of each driving element so that the fluctuation of the imagery characteristic is canceled out. This operation can maintain the imagery characteristic constant. When the imagery characteristic correction mechanism drives reticle R or lens elements 7, 10 (referred to as driven objects), however, the driven objects may shift in the lateral direction, which causes the image-forming position of the reticle pattern image projected through the projection lens system PL to shift.

The relation between the displacement of the image-forming position and the driving amount of each driven element in the imagery characteristic correction mechanism is stored as a table in the imagery characteristic data memory 21 within the imagery characteristic control system 20. When the imagery characteristic correction mechanism is driven during exposure, the imagery characteristic control system 20 supplies the amount of movement (vertical displacement along the optical axis AX and a tilting angle) of each driven element to the master control system 19. The master control system 19 reads the table out of the imagery characteristic data memory 21 and obtains the displacement of the image-forming position in the X and Y directions from the table based on the supplied driving amount. The obtained displacement is supplied to an alignment signal processor 24. If the driving amount of a driven element supplied from the imagery characteristic control system 20 is somewhere between two values written in the table, interpolation is performed. The lateral displacement of the image-forming position may be expressed as a function of the driving amount of a driven element, instead of using the table.

Although the explanation has been made on the operation of the imagery characteristic correction mechanism for general use in exposure, the imagery characteristic of the projection lens system may be measured during manufacturing or by calibrating the apparatus so as to bring the apparatus into the optimum state.

In the projection exposure apparatus of the present invention, TTR type reticle alignment microscopes 1, 2 are provided above the reticle alignment marks 31a, 31b to detect the position of the reticle R. The reticle alignment microscopes 1, 2 illuminate the reticle alignment marks 31a, 31b on the reticle R with illumination light AR having the same wavelength as the exposure illumination light (FIG. 1).

The illumination light AR emitted from the reticle alignment microscopes 1, 2 to the reticle alignment marks 31a, 31b penetrates the reticle R, and is further guided to the reference marks 41, 40 (FIG. 3) on the reference plate 15 through the projection lens system PL. The light reflected from the reference plate 15 returns through the same optical path to the reticle alignment microscopes 1, 2, and forms the images of the reticle alignment marks 31a, 31b, as well as the images of the reference marks 41, 40, on the image pickup devices within the reticle alignment microscopes 1, 2. The displacement of the center of the reticle pattern image with respect to the reference marks 41, 40 is obtained from the displacement of the image-forming positions of the respective marks.

To expose the pattern image of the reticle R onto the pattern already formed on each shot area with high alignment accuracy, the projection exposure apparatus also has an alignment sensor 12, which is of an off-axis type and of an image-detecting type, to precisely measure the position of each shot area on the wafer W. Each of the shot areas of the wafer W has a wafer mark. The alignment sensor 12 detects the coordinates of the wafer mark.

Illumination light CR emitted from the alignment sensor 12, which has a wavelength insensitive to the photoresist on the wafer W, illuminates the wafer marks on the wafer W directly. The reflective light from the wafer mark returns through the same optical path to the alignment sensor 12. An index mark is formed within the alignment sensor 12. The illumination light CR having passed through the index mark forms the image of the wafer mark and the image of the index mark on the image pickup devices, such as two-dimensional CCDs, provided within the alignment sensor 12. The image pickup signal generated by the image pickup devices is supplied to the alignment signal processor 24. The X and Y coordinates of the Z-tilt stage measured by the laser interferometer 17 are also supplied to the alignment signal processor 24. The alignment signal processor 24 determines the coordinates of the wafer mark by adding the displacement of the wafer mark relative to the index mark image to the coordinate values supplied to the laser interferometer 16. In this case, the center of the conjugate image on the wafer W of the index mark is regarded as the measurement center of the alignment sensor 12.

The alignment signal processor 24 also receives the calculation result of the displacement of the image-forming position caused by driving the imagery characteristic correction mechanism from the master control system 19. The alignment signal processor 24 adds the displacement of the image-forming position to the coordinates of the wafer mark obtained from the measurement result of the laser interferometer to further correct the coordinate of the wafer mark. The corrected coordinates are supplied to the master control system 19. The master control system 19 further corrects the coordinates of the wafer mark based on, for example, the prestored base-line amount. The XY stage 17 is registered based on the values corrected using the base-line amount.

The off-axis type alignment sensor 12 uses an optical system other than the projection lens system. Accordingly, it is not necessary to guide a light beam having a wavelength different from the exposure illumination light IL into the projection lens system PL, which has the advantage of obviating this limitation in design.

Base-line amount measurement and the exposure operation will be explained below. Prior to exposure, a base-line amount is measured. Since the center of the reticle pattern image (i.e., the center between the reticle alignment marks 31a and 31b) offsets from the measurement center of the alignment sensor 12, the base-line amount, which is the distance between the center of the reticle pattern image and the measurement center of the alignment sensor 12, must be precisely measured.

Figure 3:
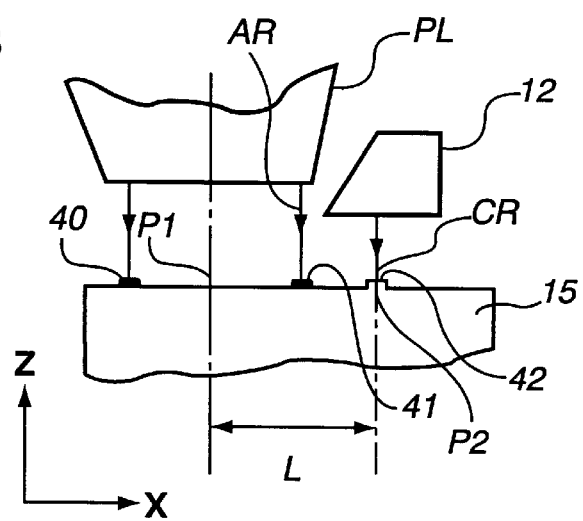
FIG. 3 is a drawing for explanation of the base-line amount measurement according to the invention.

FIG. 3 shows an example of the base-line amount measurement. As shown in the figure, the XY stage 17 is driven to move a part of the reference plate 15 on the Z-tilt stage 14 into the exposure field of the projection lens system. The XY stage 17 is then further driven so that the images of the reticle alignment marks 31a, 31b can be observed through the reticle alignment microscopes 1, 2, respectively, at the same time with the observation of the images of the reference marks 41, 40 on the reference plate 15. Next, the XY stage 17 is registered, while observing through the reticle alignment microscopes 1, 2, so that the images of the reticle alignment marks 31a, 31b are positioned symmetrically apart from the reference marks 41, 40, respectively. In other words, the center point between the reticle alignment marks 31a and 31b is positioned coincident with the center point between the reference marks 41 and 40. As a result, the center of the reticle pattern image becomes coincident with the center point between the reference marks 41 and 40 on the reference plate 15. In this state, another reference mark 42 is observed through the alignment sensor 12. The reference plate 15 is designed so that when the center point between the reference marks 40 and 41 coincides with the center of the projected pattern image of reticle R, the center of the reference mark 42 coincides with the measurement center P2 of the alignment sensor 12. The center-to-center distance between the reference marks 40 and 41 is precisely measured in advance. By measuring the offset of the reference mark 42 image formed on the image pickup device within the alignment sensor 12 from the index mark image, the offset amount ΔB of the center point of the reference mark 42 from the measurement center P2 can be accurately obtained.

The offset amount ΔB is then added to the center-to-center distance to determine the distance between the center P1 of the pattern image of the reticle R and the measurement center P2 of the alignment sensor 12, which is the base-line amount L. The position of the wafer mark obtained through the alignment sensor 12 and the alignment signal processor 24 is corrected based on the base-line amount L. The wafer W is moved based on the corrected coordinates to precisely superimpose the reticle pattern image on the circuit pattern already formed on each shot area of the wafer through the previous exposure. Since the base-line amount may change slightly due to, for example, changes in the apparatus temperature, it should be measured for every wafer or at predetermined time intervals to reliably prevent an alignment error.

If the image-forming position has changed as a result of driving the imagery characteristic correction mechanism, the following operations will be performed.

Consider the case in which the magnification is intentionally changed, or fluctuation in the magnification is corrected in order to cope with the change in the imagery characteristic or distortion of the wafer W. Such change in the imagery characteristic or wafer distortion is caused by absorption of the illumination light by the projection lens system PL during exposure and after the base-line measurement. When changing the magnification, the lens element 7 must be precisely moved along the optical axis AX However, the lens element 7 may advance or recede obliquely, while slightly offsetting from the optical axis, due to slight elastic distortion of the leaf spring 32 (FIG. 2).

Figure 4A:
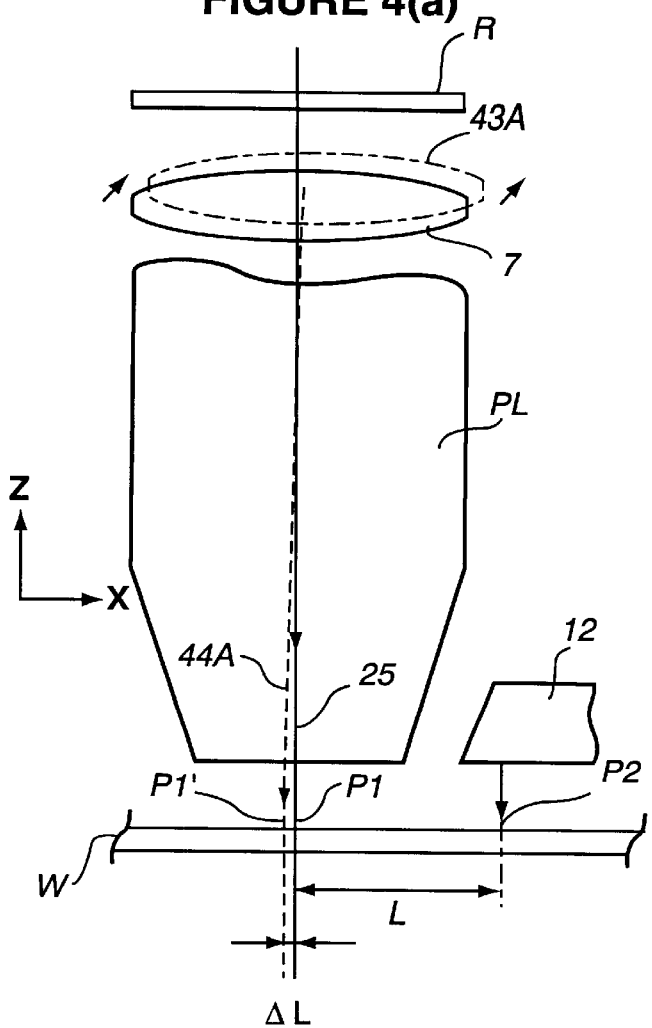
FIGS. 4(a)–4(d) are drawings for explanation of displacement of the image-forming position caused by driving the imagery characteristic correction mechanism.

FIG. 4(a) shows how the image-forming position changes when the lens element 7 moves obliquely with respect to the optical axis. In FIG. 4(a), the lens element 7 has moved from the original position depicted by the solid line to the position 43A depicted by the dashed line, which causes the major beam 25 passing through the center P1 of the projected reticle pattern image to shift to the optical path 44A depicted by the dashed line. As a result, the image-forming position on the wafer W moves from the center P1 to the position P1'. This is the displacement ΔL of the image-forming position in FIG. 4(a). The base-line amount, which is a distance between the measurement center P2 of the alignment sensor 12 and the center P1' of the shifted pattern image, becomes (L+ΔL). Thus, the displacement of the image-forming position can be measured as a change of the base-line amount. Such change in the base-line amount results in an alignment error.

If the reticle R of FIG. 1 slightly shifts in the lateral direction (perpendicular to the optical axis AX) when it is driven along the optical axis AX to correct the imagery characteristic, the image-forming position on the wafer W changes.

Furthermore, when the shot area on the wafer W is deformed into a trapezoidal shape by the influence of the previous process, a part of the lens elements, for example, lens element 7, in the projection lens system PL may be tilted with respect to a plane perpendicular to the optical axis AX. In this case, the change of the image-forming position is in principle, rather than the incidental displacement which would not occur in the design aspect.

Figure 4B:
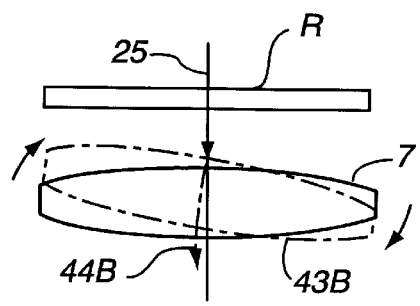

FIG. 4(b) shows displacement of the image-forming position caused when the lens element 7 is tilted with respect to a plane perpendicular to the optical axis AX. In FIG. 4(b), the lens element 7 is tilted from the original position depicted by the solid line, which is perpendicular to the optical axis AX, to the position 43B depicted by the dashed line in the clockwise direction. The optical path of the major beam 25 shifts to the left, resulting in the optical path 44B depicted by the dashed line. This shift causes the image-forming position to slightly shift to the left.

Furthermore, the projection lens system is generally adjusted during the initial adjustment so as to obtain the optimum imagery characteristic. At this time, the projection lens system PL may be adjusted while leaving the reticle R or lens elements 7, 10 inclined with respect to the optical axis AX.

Figure 4C:
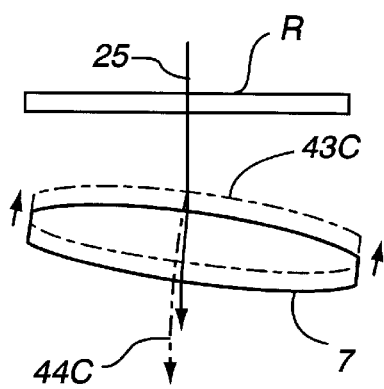

FIG. 4(c) shows an example in which the lens element 7 is driven to correct the imagery characteristic, which is symmetrical with respect to the optical axis AX, with the lens element 7 tilted. The lens element 7 is already inclined in the clockwise direction in its original position depicted by the solid line. From this state, the lens element 7 is moved along the optical axis to the position 43C depicted by the dashed line. Because the optical axis of the lens element 7 is inclined, the lens element 7 moves obliquely. As a result, the imageforming position shifts to the left, as indicated by the optical path 44C.

Figure 4D:
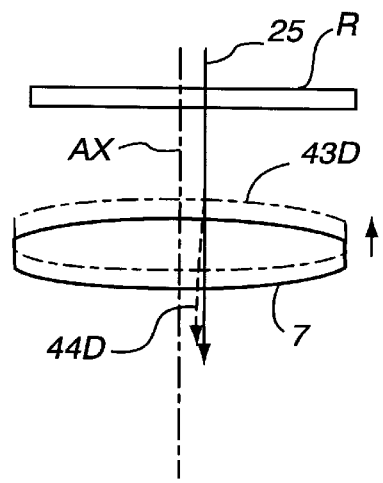

FIG. 4(d) shows an example in which the projection magnification is adjusted with the pattern center of the reticle R offset from the optical axis AX of the projection lens system PL. In FIG. 4(d), the optical axis of the lens element 7 is coincident with the optical axis AX of the projection lens system. However, the optical path of the major beam 25 passing through the pattern center of the reticle R is offset from the optical axis AX to the right. From this state, the lens element 7 is moved along the optical axis AX to the position 43D depicted by the dashed line to correct the projection magnification. If the projection magnification is changed to fit the projected image to the distortion of the wafer W, the image-forming position slightly shifts to the left as shown by the optical path 44D of the dashed line, because the center axis of the magnification change is offset from the pattern center of the reticle R.

Thus, taking into account the functional imperfection of the apparatus and implicit cause of the displacement, displacement of the image-forming position is caused when the imagery characteristic is corrected. This displacement results in an alignment error unless some steps are taken. One method for preventing the alignment error is to measure the base-line amount frequently; however, this considerably lowers the throughput of the exposure process. In view of these problems, the present invention provides an effective technique for correcting displacement of the image-forming position caused by the movement of the imagery characteristic correction mechanism. The imagery correction characteristic mechanism is preliminarily driven during the initial adjustment of the apparatus, and the shifting amount of the image-forming position (referred to as an image shift amount) caused by the movement of the imagery characteristic correction mechanism is measured. The image shift characteristic is stored as a table. During the actual exposure, the image-forming position is corrected based on the image shift characteristic To measure the image shift amount, the reticle R and the lens elements 7, 10, as the driven objects of the imagery characteristic correction mechanism, are separately driven to obtain the relation between the driving amount of the driven object and the image shift amount independently. There are several methods for measuring the image shift amount. Base-line amount measurement is one of the methods. The image shift amount is equivalent to the displacement of the center of the pattern image of the reticle R. The image shift amount is obtained based on the base-line amount measurement.

The master control system 19 directs the imagery characteristic control system 20 (FIG. 1) to drive the reticle R and the lens elements 7, 10 one by one. For example, the reticle R is first moved along the optical axis AX by a predetermined amount, and the change in the base-line amount is recorded. Since the base-line amount may change under the influence of environmental temperature, measurement must be adequately repeated to obtain sufficient data to calculate the average. Furthermore, if the imagery characteristic is corrected by tilting the reticle R not only during the initial adjustment, but also during exposure, then data must be taken that indicates the relation between the driving amount for the inclination angle of the reticle R and the change in the base-line amount. The aforementioned measurement is applied to the lens elements 7 and 10 in the same manner, thereby clarifying the relation between the driving amount and the image shift amount for each of the reticle R and lens elements 7, 10. Of course, the measuring method of the image shift amount is not limited to this technique. For example, the reticle pattern may be exposed onto the wafer W, and displacement of the pattern image on the wafer W may be directly measured. Alternatively, a photoelectric sensor may be provided above the Z-tilt stage 14 to observe an appropriate mark image on the reticle R.

The relation between the driving amount and the image shift amount for each of the reticle R and lens elements 7, 10 is stored as a table in the imagery characteristic data memory 21. The image shift amount may be expressed as a function of the driving amount. If the relation between the image shift amount and the driving amount is linear, only the coefficient is stored. If the image shift amount does not change linearly with the driving amount due to elastic distortion of the leaf spring 32, then the relation between the image shift amount and the driving amount is approximated through quadratic approximation, and the coefficient of each term is stored Alternatively, the nonlinear relation may be stored as a table, and linear interpolation may be performed. The aforementioned process is carried out prior to exposure. Consequently, when the imagery characteristic correction mechanism is driven during the actual exposure, the image shift amount is automatically determined. In actual use, a plurality of driven objects are driven simultaneously, and the overall image shift amount is obtained based on the vector sum of the image shift amount generated by the respective driven objects.

Base-line amount measurement is performed periodically, for example, at the beginning of every lot. The difference between the measurement result and the original base-line amount is an image shift amount. This value is used as an offset to adjust the image-forming position. The change in the image-forming position caused by the positional adjustment becomes an alignment error. Therefore, after the initial base-line amount measurement, the image-forming position is corrected based on the calculated image shift amount. At this time, by adding the image shift amount to the measured coordinates of the wafer mark through the alignment signal processor 24, the XY stage 17 is automatically moved to the appropriate position taking into account the image shift amount when it is driven to the actual exposure position after the base-line amount measurement, thereby achieving accurate exposure.

Alternatively, with the base-line amount reset to the initial state, the change in the image shift amount may be corrected by driving the reticle R, rather than the XY stage 17. The base-line amount itself may be corrected using the calculated image shift amount. Although it is basically preferable to correct the imagery characteristic every time the imagery characteristic changes, correction may be made for each shot area when driving the driven objects during exposure. If this is the case, correction of the image shift amount is preferably performed every time the imagery characteristic is corrected. This method is especially preferable to a scanning exposure type (e.g., a step-and-scan type) projection exposure apparatus because it is undesirable to insert unnecessary operations during scanning, and the change in the image characteristic in a shot area is negligible.

The table (or function) representing the image shift characteristics, that is, the relation between the image shift amount and the driving amount of each driven object in the imagery characteristic correction mechanism, does not change over short periods of time. However, the image shift characteristic may change due to long-term fluctuation in the positional relation of each parts. Therefore, it is preferable to update the table at regular maintenance intervals. In a recent projection exposure apparatus, the illumination conditions for the reticle R are variable. The incident angle of illumination light for illuminating the reticle R changes in accordance with the illumination conditions, which may affect the image shift amount. To this end, the image shift characteristics (e.g., a table) are preferably obtained and stored for every condition.

In the example described above, the image-forming position is corrected based on the relation between the image shift amount and the driving amount of the imagery characteristic correction mechanism. However, the image-forming position may be corrected by directly measuring the lateral displacement (perpendicular to the optical axis AX) of each driven object in the imagery characteristic correction mechanism. This method requires an extra displacement sensor, but can prevent an error even when unexpected fluctuation occurs in the imagery characteristic, and the relation between the driving amount of the imagery characteristic correction mechanism and the lateral displacement of the lens elements 7, 10 has greatly changed. In such a case, an alignment error is unavoidable using a prestored table.

As an example of the displacement sensor, capacitance gap sensors 38, 39 are provided on the inner surface of the side wall of the lens holder 8 and the lens barrel 23, respectively, in the projection lens system PL, as shown in FIG. 2. The gap sensor 38 measures the distance from the outer surface of the side wall of the lens holder 6 to obtain the relative change (lateral displacement) between the lens holders 6 and 8. The gap sensor 39 measures the distance from the outer surface of the side wall of the lens holder 8 to obtain the relative change (lateral displacement) between the lens holder 8 and the lens barrel 23. The relative displacement of the lens holder 6 with respect to the lens barrel 23 is the sum of the two displacement amounts. Because the lens elements 7, 10 are fixed to the lens holders 6, 8, respectively, the lateral displacement of the lens holders 6, 8 correspond to the lateral displacement of the lens elements 7, 10.

Displacement may occur not only in the lateral direction, but also in the pivotal direction about an axis perpendicular to the paper of FIG. 2. To assure the measurement accuracy even when the lens elements 7, 10 tilt, gap sensors 38, 39 are provided at the pivot position to remove the influence of the inclination (displacement in the pivotal direction) of the lens element. Alternatively, sensors may be provided at other locations to accurately measure the displacement logically caused by pivotal movement of the lens elements 7, 10, as well as the lateral displacement.

In this example, the relation between the output of the gap sensors 38, 39 and the image shift amount is also obtained in advance by preliminarily driving the imagery characteristic correction mechanism. The image shift amount is determined based on the base-line amount measurement, similar to the aforementioned examples. The relation is stored as a table, or a function, in the same manner. With this method, even if the output from the gap sensors 38, 39 contain the influence of inclination of the measuring surface of the lens holders 6, 8, the image shift amount can be accurately calculated based on the prestored relation between the actual image shift amount and the measurement values. The lateral displacement may be logically determined based on the lateral displacement of the lens elements 7, 10.

When the reticle R is driven to correct the imagery characteristic of the projection lens system, it may be driven in the rotational direction. If this is the case, the rotational component of the image shift will be corrected in the same manner. The relative offset of the rotational angle between the reticle R and the wafer W is corrected by rotating either of them.

It should be noted that the image shift component caused by the offset of the center of the projected image from the pattern center of the reticle R (FIG. 4(*d*)) occurs only when the projection magnification is intentionally changed, but does not occur with constant magnification. Therefore, correction of the image shift amount under this situation must be separately performed.

The projection exposure apparatus of a second embodiment will now be described. In this embodiment, the base-line amount is measured again when the driving amount of a driven object of the imagery characteristic correction mechanism exceeds a predetermined value. The basic structure of the apparatus is the same as the first embodiment.

The relation between the image shift amount and the driving amount of each driven object of the imagery characteristic correction mechanism is obtained in advance. Based on this relation, an acceptable range of image shift is determined. The marginal driving amount for a correction is determined based on the acceptable range for each driven object of the imagery characteristic correction mechanism. If there are multiple projection exposure apparatus involved, the acceptable range of the image shift amount and the marginal driving amount of each driven object may be determined for each projection exposure apparatus. If the space among the apparatus is small, however, a common value may be determined for the multiple apparatus. If the imagery characteristic correction mechanism is composed of a plurality of correction elements (driven objects), the sum of the image shift amounts caused by the respective correction elements must be obtained. The total of the respective shift amounts may be simply calculated, or alternatively, the sum may be weighted taking into account the effect to the image shift. This method is closely related to the throughput. Accordingly, it is efficient to change the acceptable range of the image shift depending on the pattern to be exposed. In a manufacturing process which does not require high throughput, the acceptable range is made narrow, and the number of times of base-line amount measurement is increased. Whenever the image shift amount exceeds the acceptable range, the base-line amount is measured again using the reticle alignment microscopes 1, 2 and alignment sensor 12 (FIG. 1). The XY stage 17 is registered based on the newly measured base-line amount L. When the image shift amount exceeds the acceptable range, an alert may be issued, instead of automatically measuring the base-line again.

In this embodiment, the time when the base-line amount is measured is determined using the acceptable range of image shifting as a reference. However, an acceptable range may be set for the change of the imagery characteristic, and both the imagery characteristic and base-line amount measurement may be corrected when the change exceeds the acceptable range, without making correction to the imagery characteristic until exceeding the acceptable range. Preferably, a combination between the acceptable range of the change in the imagery characteristic and the acceptable range of the change in the image shift amount is selected in view of the preciseness and the throughput. Although, in the embodiment, an image shift amount is determined based on the driving amount of the imagery characteristic correction mechanism to determine the timing of base-line amount measurement, the necessity of the base-line amount measurement may be determined based on the lateral displacement obtained by the gap sensors 38, 39 during driving of the lens elements 7, 10 (FIG. 2).

In this embodiment, the base-line amount is measured directly. Therefore, alignment errors do not occur even if the relation between the driving amount of the driven object and the image shift amount changes due to the change in the apparatus condition, unlike the first embodiment. The structure is simpler with fewer error factors, which can reduce the number of adjustment steps in the apparatus.

In yet another embodiment, displacement of the image-forming position may be corrected by a combination of the first and second embodiments. The feature of the first embodiment is to correct displacement of the projected image caused by driving the imagery characteristic correction mechanism during exposure, based on the formula or table representing the relation between the displacement (image shift amount) and the driving amount of the imagery characteristic correction mechanism, which has been obtained in advance. This method is effective to a small amount of change. Whenever the driving amount of the imagery characteristic correction mechanism changes slightly, the image displacement is promptly and reliably corrected. If the displacement is large, however, and the image shift must be corrected by a large amount, then the correction error increases. In the second embodiment, the image shift is not corrected until the driving amount of the imagery characteristic correction mechanism exceeds the marginal value. By combining the first and second embodiments, advantages of both methods are efficiently exhibited. More particularly, within a certain range of the driving amount of each drive object of the imagery characteristic correction mechanism, the image displacement is corrected based on the formula or table representing the relation between the image shift amount and the driving amount of the imagery characteristic correction mechanism, according to the first embodiment. When the driving amount exceeds a predetermined range, the image shift amount is determined based on direct measurement of the base-line amount, as in the second embodiment. The combination of the advantages of the two embodiments can prevent throughput drop and occurrence of an error in displacement correction without using direct measurement. The base-line amount measurement is performed on a time basis (at predetermined time intervals) or correction amount basis (whenever the necessary correction amount exceeds a certain level).

Regarding the imager characteristic correction mechanism of the projection lens system, the driving mechanism for mechanically driving the driven object may be replaced by a mechanism for adjusting the gas pressure within a sealed space between the lenses included in the projection lens system.

Figure 5:
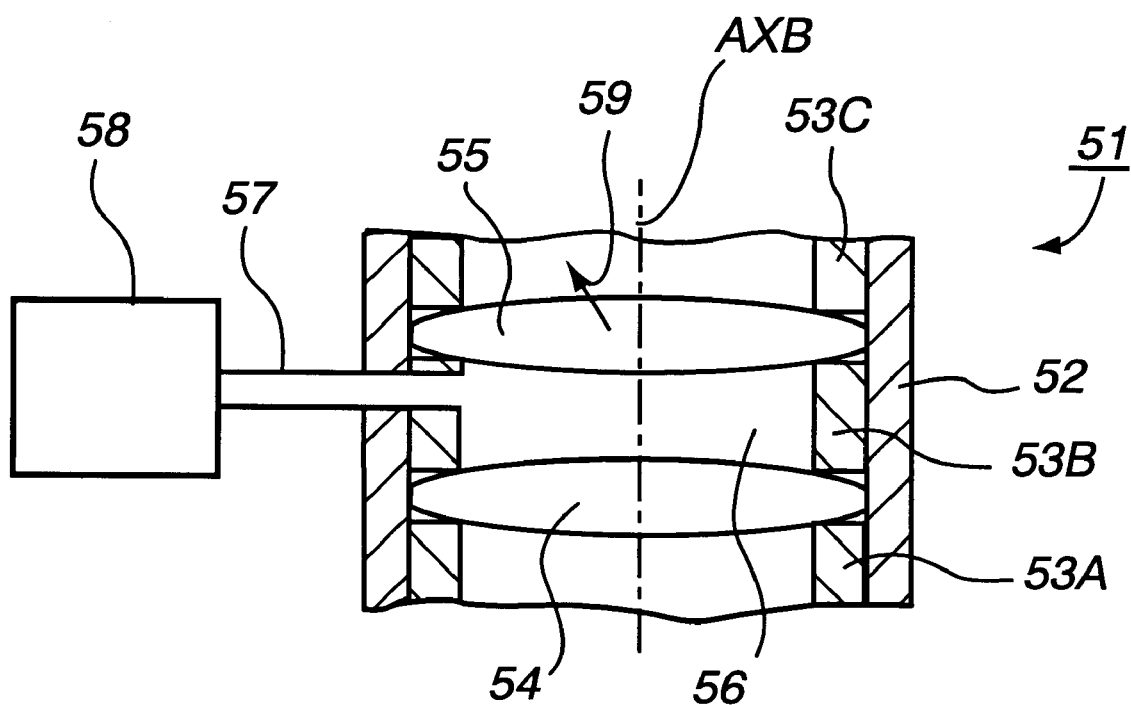
FIG. 5 is a partial cross-sectional view of another example of the imagery characteristic correction mechanism.

FIG. 5 is a partial cross-sectional view of a part of the projection lens system having a gas pressure adjustment mechanism. Lens elements 54, 55 are fixed between the lens holders 53A and 53B, and between the lens holders 53B and 53C, respectively. The lens holders 53A, 53B and 53C are accommodated in the lens barrel 62 of the projection lens system 51. A sealed space 56 is defined by the lens elements 54, 55 and lens holder 53B. The sealed space 56 is filled with pressure-adjusted gas supplied from an external air supply 58 through an inlet tube 57 penetrating the lens holder 53B and the lens barrel 62. The pressure within the sealed space 56 is adjusted to change the refractive index of the internal gas, whereby the projection magnification, isotropic distortion (barrel distortion), spherical aberration, image plane distortion, etc. can be corrected.

Even with this type of imagery characteristic correction mechanism (correcting the imagery characteristic by changing the gas pressure within the projection lens system 51) of FIG. 5, lateral displacement of the imageforming position may occur. For example, the lens element 55 slightly moves obliquely with respect to the optical axis AXB, as indicated by the arrow 59. This is because the lens element 55 moves both in the optical axis direction and the lateral direction, resulting in lateral displacement of the image-forming position. To correct the displacement, the relation between the image shift amount and, for example, the pressure within the sealed space 56 is stored as a table in advance, and the image shift amount is corrected depending on the internal pressure.

Although an off-axis type alignment sensor is used in this example, this invention is applicable to the case in which a TTR type alignment sensor is used. The TTR type alignment sensor emits illumination light having a wavelength different from exposure light through the reticle R and the projection lens system PL to detect the position of the wafer mark. With the TTR type alignment sensor, if the image shift amount of the projected image formed through the projection lens system varies depending on the wavelength, alignment error occurs unless correction is made. Such error can be efficiently corrected by application of this invention. This invention can be equally applied to an exposure apparatus using a TTL type alignment sensor. The TTL type alignment sensor observes the wafer mark through the projection lens system, but not through the reticle R. The positional shift of the reticle R directly affects the alignment error, but such error can be corrected through application of the present invention. In sum, the present invention is efficiently applicable to the case in which the alignment sensor does not detect the reticle alignment mark and the wafer alignment mark simultaneously using a light beam having the same wavelength as the exposure light.

This invention is not limited to a stepper type projection exposure apparatus, but is applicable to a scanning exposure type (step-and-scan type) projection exposure apparatus.

According to the projection exposure apparatus of the present invention, is the imagery characteristic of the projection lens system is first corrected by driving the imagery characteristic correction mechanism. Driving the imagery characteristic correction mechanism generally causes the image-forming position of the projected image formed through the projection lens system to shift from the proper position. The displacement of the image-forming position is detected. Meanwhile, the substrate position is detected by the substrate position detector. The detected substrate position is corrected based on the displacement of the image-forming position. This structure can efficiently suppress occurrence of an alignment error due to movement of the imagery characteristic correction mechanism, thereby achieving high imagery property and alignment preciseness.

According to the projection exposure apparatus of a second embodiment, the imagery characteristic of the projection lens system is corrected similarly to the first embodiment. The baseline amount is measured again by the baseline amount measuring device after the correction of the imagery characteristic, taking into account the lateral displacement of the image-forming position caused by correction of the imagery characteristic. The detection result of the substrate position detector is corrected based on the remeasured base-line amount. Accordingly, even if the image-forming position shifts according to the movement of the imagery characteristic correction mechanism, alignment error is prevented.

Another embodiment of the invention will now be described with reference to FIGS. 6–8.

Figure 6:
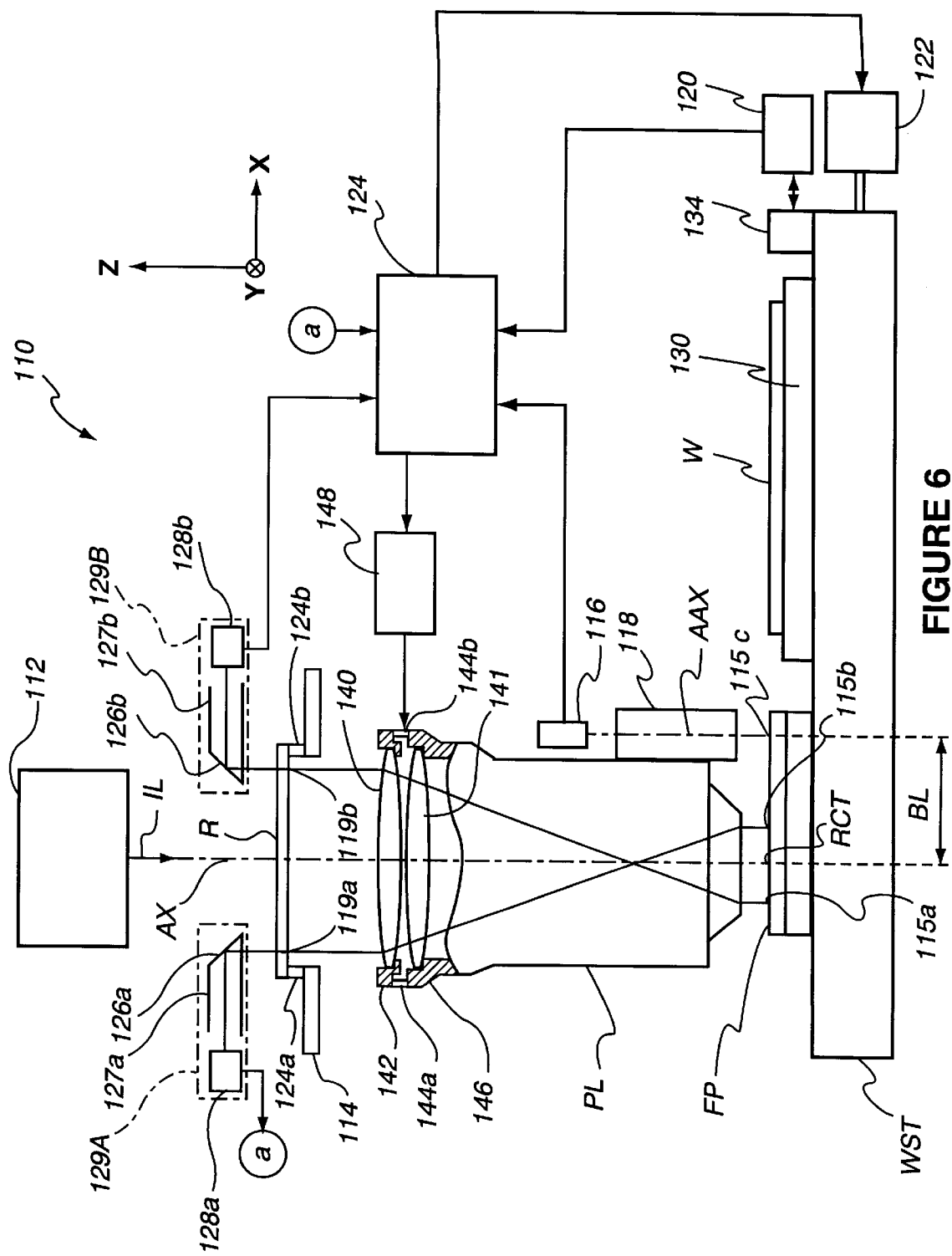
FIG. 6 is a schematic diagram showing the structure of the projection exposure apparatus according to another embodiment of the invention.

FIG. 6 illustrates the projection exposure apparatus 110 to which an embodiment of the invention is applied. This projection exposure apparatus is a step-and-repeat type reducible projection exposure apparatus (so-called stepper).

The projection exposure apparatus 110 has an illumination system 112 for illuminating the reticle R, which is used as a mask, with exposure illumination light IL. The reticle R is supported on a reticle stage 114. The projection optical system PL projects the master pattern formed on the reticle R onto the wafer W (as an exposed substrate). The wafer is supported on the wafer stage WST, which two-dimensionally moves within a reference plane. The projection exposure apparatus 110 also has an off-axis type alignment microscope 118 for detecting alignment reference marks that are formed on the wafer W and serve as position-detection marks, a laser interferometer 120 for measuring the position of the wafer stage WST, and a driving system 122 for driving the wafer stage WST. The overall operation of the projection exposure apparatus is controlled by a master controller 124 consisting of a microcomputer.

The illumination system 112 includes a light source (mercury-vapor lamp or excimer laser), a shutter, a blind, an input lens, a fly-eye lens, a relay lens, a main condenser lens, etc., although they are not shown in the figure. The illumination system 112 illuminates the reticle R such that exposure illumination light IL emitted from the light source has a uniform illuminance distribution and illuminates the reticle R under constant conditions. The exposure illumination light IL is monochromatic light (or quasimonochromatic light) supplied through the fly-eye lens. The (exposure) wavelength of illumination light IL is, for example, 365 nm when using mercury vapor bright-line (i-ray), and 248 nm when using a KrF excimer laser.

The reticle R is fixed onto the reticle stage 114 through reticle holders 124a and 124b by means of, for example, vacuum adsorption. The reticle stage 114 is driven by a driving system (not shown) in the X direction (horizontal in the paper of FIG. 6), the Y direction (perpendicular to the paper) and the θ direction (rotational direction within the XY plane). Reticle alignment marks (for example, cross marks) 119a and 119b are formed on the reticle R, as well as the master pattern, to align the reticle R. A pair of reticle microscopes 129A, 129B are positioned above the reticle stage 114 to detect the reticle alignment marks 119a, 119b, respectively.

Figure 7:
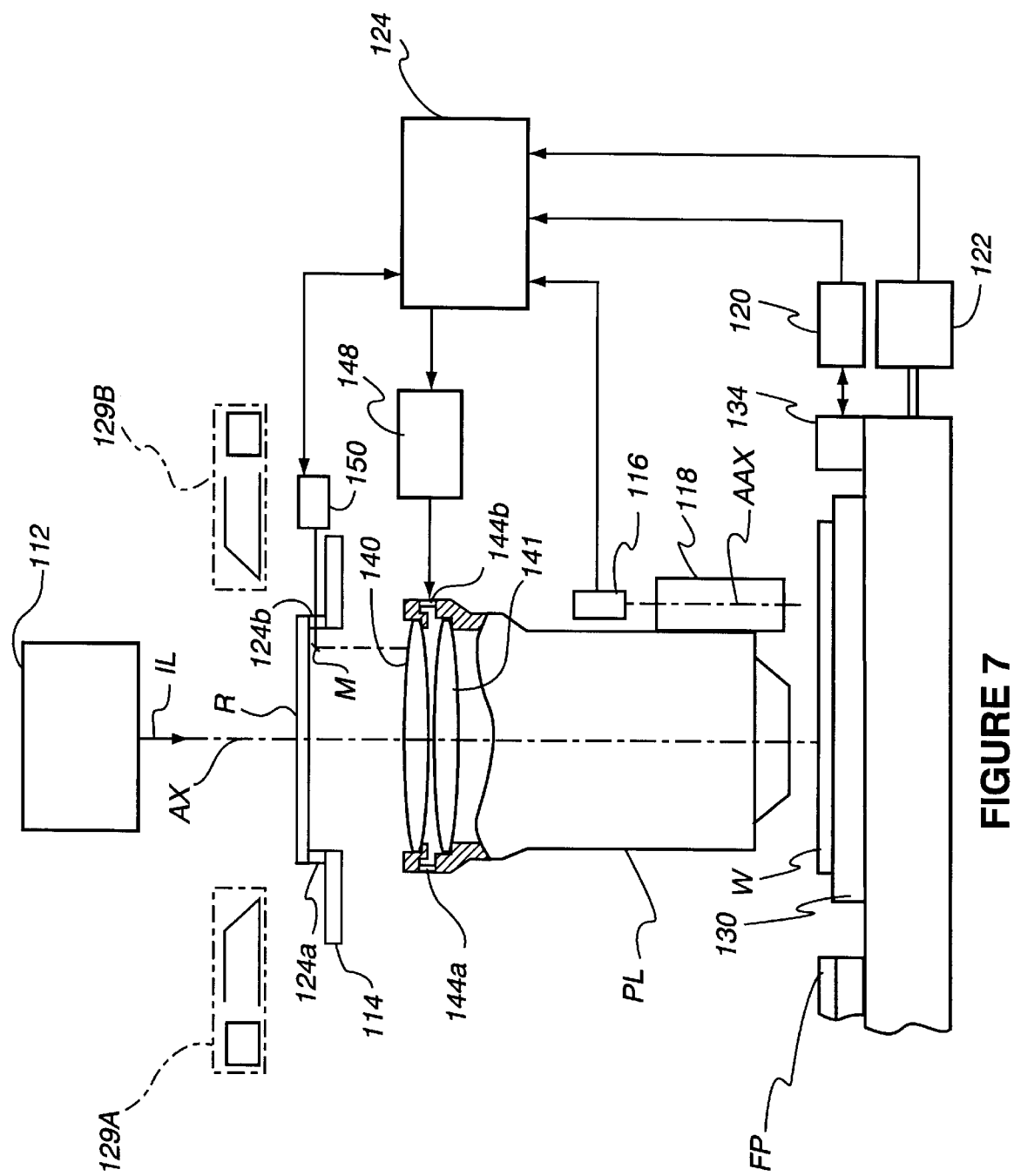
FIG. 7 illustrates the projection exposure apparatus of FIG. 6, during exposure.
Figure 8:
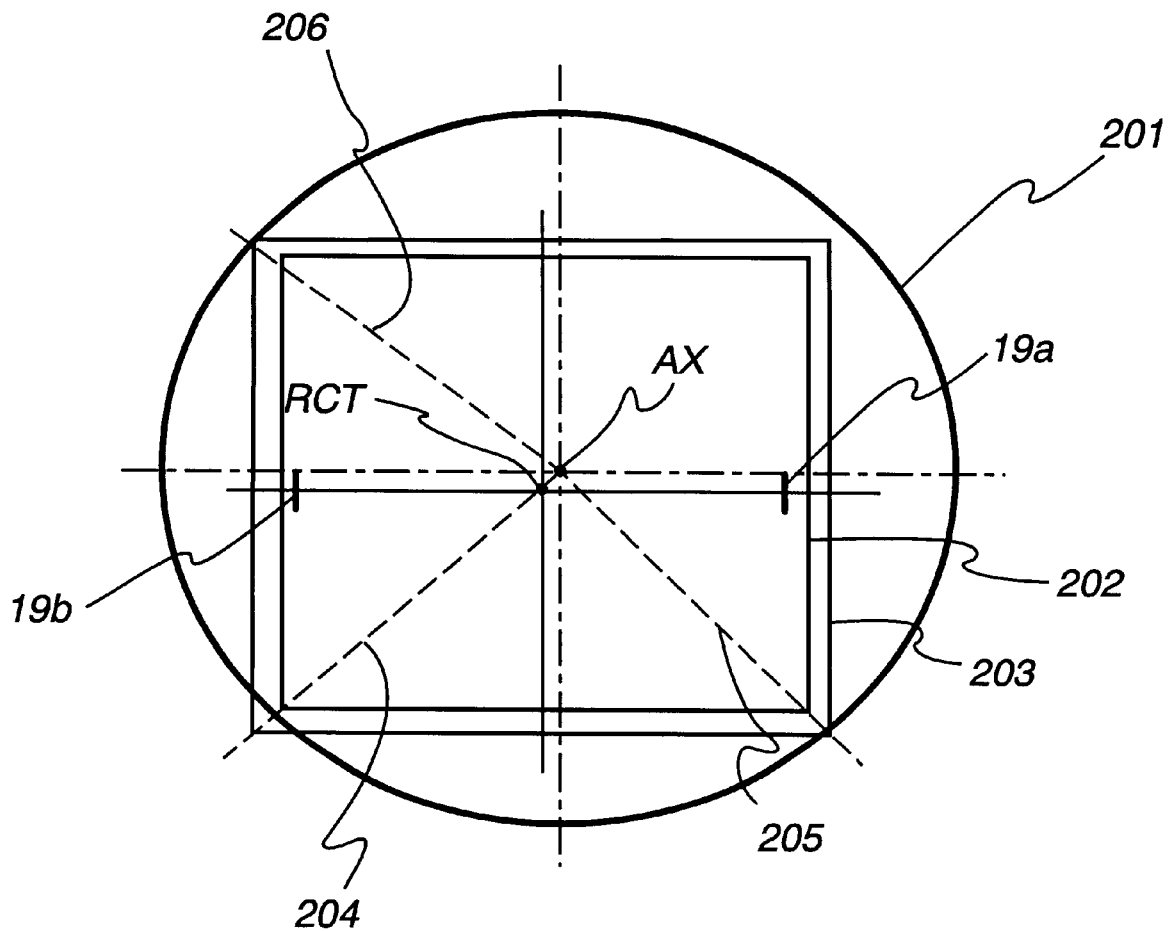
FIG. 8 is a diagram used for explaining how the reticle is aligned in the apparatus of FIG. 6 and how the problem in the prior art is solved by the invention.

The alignment microscopes 129A, 129B are alignment sensors of an image-processing type and can recede from the optical path during actual exposure (FIG. 7). The alignment microscope 129A has a bending mirror 126a, a lens system 127a including an object lens (not shown), an image pick-up device 128a such as a CCD, and a signal processor (not shown). The lens system 127a also includes an index plate in which an index mark is formed. A portion of exposure light, which branches off from the exposure light source, is extracted and used as a light source of the alignment microscope 129A. The other alignment microscope 129B similarly has a bending mirror 126b, a lens system 127b including an object lens (not shown), an image pick-up device 128b such as a CCD, and a signal processor (not shown). The lens system 127b includes an index plate in which an index mark is formed.

The reticle microscopes 129A, 129B are used to detect the relative positions of the reticle marks 119a and 119b with respect to the wafer reference marks (which will be described below) for both base-line measurement and reticle alignment. Output from the reticle microscopes 129A, 129B is supplied to the master controller 124, which then performs reticle alignment.

The projection optical system PL is composed of a plurality of lens elements including lens elements 140 and 141 shown in FIGS. 6 and 7. The lens elements 140 and 141 have a common optical axis and are arranged in a both-side telecentric configuration. Among the lens elements, the uppermost lens element 140, which is positioned closest to the reticle stage 114, is supported by a support ring 142. The support ring 142 is held by flexible driving elements, for example, piezoelectric elements 144a, 144b, 144c (only two of these are shown in FIGS. 6 and 7) and supported at three points. The support ring 142 is connected to the lens barrel 146. Three points along the periphery of the lens element 140, which correspond to the piezoelectric driving elements 144a, 144b, 144c, are independently driven along the optical axis AX of the projection optical system PL. By virtue of the driving elements, the lens element 140 can be translated along the optical axis AX, or tilted with respect to a plane perpendicular to the optical axis AX according to the displacement of the driving elements 144a, 144b, 144c. A voltage supplied to the driving elements 144a, 144b, 144c is regulated by a magnification correcting controller 148 based on a command from the master controller 124, thereby adjusting the displacement of the driving elements 144a, 144b, 144c. The optical axis AX of the projection optical system PL shown in FIG. 6 is a common optical axis of the lens element 141 and other lens elements (not shown) fixed to the lens barrel 146. The optical axis AX is defined by a composition of center axes of these lens elements, each center axis containing a subtle offset component.

The magnification of the projection optical system PL is changed by moving the lens element 140 along the optical axis AX. The driving elements 144a, 144b, 144c and the magnification correcting controller 148 for controlling the displacement of the respective driving elements constitute a magnification correcting mechanism.

The optical axis AX of the projection optical system PL is aligned with the Z axis, which is perpendicular to a plane in which the reticle stage 114 moves. The projection optical system PL has a prescribed reduction magnification $\beta$ (e.g., $\beta=\frac{1}{5}$). When the reticle R is illuminated by illumination light IL with a uniform illuminance after the pattern of the reticle R is aligned with the shot area on the wafer W, the pattern is scaled down by the projection optical system PL according to the magnification $\beta$, and projected onto the wafer W coated with photoresist. Thus, a reduced pattern image is formed in each shot area (e.g., each LSI chip area) on the wafer.

The wafer W is fixed to the wafer holder 130, which is mounted on the wafer stage WST, through vacuum adsorption. The wafer stage WST comprises a Y stage that moves along the Y direction (perpendicular to the paper of FIG. 6) on the base (not shown), an X stage that moves along the X direction (horizontal in the paper of FIG. 6), and a Z stage that can move along the optical axis AX (in the Z direction) together with the wafer holder 130 and the reference plate FP in small increments. This structure is not shown in FIG. 6 and is simply illustrated as a wafer stage WST.

A pair of rotating mirrors 134 are provided on the top surface of the wafer stage WST along the adjacent edges thereof. A pair of laser interferometers 120 are positioned opposed to the rotating mirrors 134. The laser interferometers 120 emit laser beams toward the rotating mirrors 134, and receive the reflected light beam to measure the position of the wafer stage WST at a resolution of, for example, 0.01 $\mu$m. The rotating mirrors 134 consist of an X rotating mirror, which has a reflective surface perpendicular to the X axis and a Y rotating mirror, which has a reflective surface perpendicular to the Y axis. The laser interferometers 120 consist of an X laser interferometer for measuring the X position of the wafer stage WST, and a Y laser interferometer for measuring the Y position of the wafer stage WST, thereby determining the XY coordinates of the wafer stage WST.

The measurement values from the laser interferometers 120 are supplied to the master controller 124. The master controller 124 moves the wafer stage WST through the driving system 122, while monitoring the measured values of the laser interferometers 120, thereby registering the wafer W in a correct position.

A reference plate FP is fixed to the wafer stage WST wherein a top surface of the reference plate FP is level with the top surface of the wafer W. Several reference marks (including reference marks 115a, 115b used for base-line measurement, which will be described below) are formed on the surface of the reference plate FP.

The alignment microscope 118 is an off-axis type alignment sensor fixed on the side of the projection optical system PL. In general, the projection optical system PL is designed taking into account the permeability of exposure light having an exposure wavelength. If a light beam having a different wavelength is used as an alignment light beam, chromatic aberration and other problems occur. It is still preferable, however, to use a light beam with a different wavelength as alignment light to avoid exposing the resist layer on the substrate and adversely affecting the process. If a TTL type alignment microscope with a different wavelength is used, design of the projection optical system PL is limited. The off-axis type alignment sensor is a lens system separate from the projection optical system PL, which does not restrict the projection optical system. Therefore, an off-axis alignment sensor is preferred.

The alignment microscope 118 used in this embodiment has an image processing function and comprises a light source, such as a halogen lamp, which can emit broad band illumination light, an object lens, an index plate, and an image pick-up device such as a CCD, although these elements are not shown. Illumination light emitted from the light source included in the alignment microscope 118 passes through the object lens within the alignment microscope 118 and strikes the wafer W (or the reference plate FP). The illumination light is reflected by the wafer mark area (not shown) on the wafer W, returns to the alignment microscope 118 and passes through the object lens and the index plate. A wafer mark image and an index image of the index plate are formed on the image pick-up plane of the CCD. These images are photoelectrically converted to electric signals, which are processed by the signal processor 116. The master controller 124 calculates the relative position of the wafer mark with respect to the index mark, based on the data from the signal processor 116.

As is clear from FIG. 6, the position of the wafer stage WST slightly differs between when the pattern of the reticle R is projected to the wafer W and when the wafer reference marks are detected by the alignment microscope 118. The positional relationship (i.e., base-line amount BL) between these two situations must be precisely measured to correct the position of the wafer W. For this reason, the base-line amount is measured prior to detecting the wafer reference marks.

(1) The reticle R is first aligned with the projection optical system PL. The reticle stage 114 is driven so that the center RCT of the reticle pattern image (referred to as a reticle image) comes into alignment with the optical axis AX of the projection optical system PL. The reticle alignment operation is executed by the master controller 124. If a plurality of wafers are successively exposed, reticle alignment is performed only at the beginning of the successive exposure.

The master controller 124 drives the wafer stage WST through the driving system 122 based on the data stored in the memory (not shown), while monitoring the measurement results from the laser interferometers 120 so that the alignment marks 115a and 115b (FIG. 6) formed on the reference plate FP are positioned in predetermined aligning positions.

Then, the master controller 124 adjusts the position of the reticle stage 114 through the driving system (not shown), while monitoring output signals from the reticle microscopes 129A and 129B so that the reticle marks 119a and 119b align with the wafer reference marks 115a and 115b, respectively. During adjustment, the reticle microscopes 129A and 129B detect the relative positions between the reticle marks 119a, 119b and the wafer reference marks 115a, 115b using a light beam having a detection wavelength that is equal to the exposure wavelength. Accordingly, the positional relationship between the projected image of the reticle marks and the projected image of the circuit pattern of the reticle R formed in actual exposure is maintained without suffering influence of chromatic aberration. Through the reticle adjustment operation, the center RCT of the reticle image comes into alignment with the optical axis AX FIG. 6 shows the state in which reticle alignment has been completed.

How to determine the prescribed aligning position described above will now be explained.

The master controller 124 drives the wafer stage WST so that the reference plate FP is positioned under the projection optical system PL. In this state, the master controller 124 controls the magnification correcting controller 148 to greatly change the magnification of the projection optical system PL, while monitoring the reticle marks 119a 119b and the wafer reference marks 115a, 115b on the reference plate FP simultaneously through the reticle microscopes 129A, 129B. Since the projection magnification has been changed, the wafer reference marks 115a, 115b on the reference plate FP look as if they moved relative to the reticle marks 119a, 119b. Then, the master controller 124 drives the wafer stage WST through the driving system 122 and the Z stage (not shown) so that the reference plate FP follows the focal plane into the focal position, based on the output from the Z-position sensor (not shown, but in the focal point detection system).

If the reticle center is offset from the optical axis AX, the changing (shifting) amount of the wafer mark 115a differs from that of the wafer mark 115b, and it is observed that the center position between the wafer reference marks 115a and 115b has shifted because the center of the reference plate FP is not in alignment with the optical axis AX. Consequently, the center of the reticle R, which was aligned with reference to the wafer reference marks 115a and 115b on the reference plate FP is also offset from the optical axis AX.

The shifting amount of the center of the reference plate FP is expressed as a product of a distance from the optical axis AX and a change in magnification. The shifting amount of the reference plate FP and the change in magnification can be calculated from the measurement results from the reticle microscopes 129A, 129B and the command value supplied from the master controller 124 to the magnification correcting controller 148, respectively. Therefore, the distance of the center of the reference plate FP from the optical axis AX can be obtained based on the shifting amount and the change in magnification. The distance from the optical axis AX is expressed as a vector. The wafer stage WST is driven in the X and Y directions according to the X and Y components of the position vector to bring the center of the reference plate FP into alignment with the optical axis AX.

When the reference plate FP is settled to a new position, the reticle stage 114 is again driven so that the reticle marks 119a, 119b align with the wafer reference marks 115a, 115b on the reference plate FP. At the same time, the projection magnification of the projection optical system PL is adjusted to confirm the focal state. If the reference plate FP deviates from the optical axis AX due to adjustment of the magnification, then the same process is repeated until the center of the reference plate FP does not deviate from the optical axis AX.

Alignment of the reticle R and the optical axis AX may be performed by exposing a test pattern onto the wafer W, instead of using the reticle microscopes 129A, 129B and the reference plate FP. For example, a test pattern is first exposed onto the wafer W at a normal magnification. Then, the test pattern is again exposed onto the same wafer W at a different magnification to obtain the amount of positional shift. The position of the reticle R may be adjusted so that the amount of the positional shift becomes equal at any points located on the same level (height) within the wafer W.

If the magnification is adjusted in the maximum span of the magnification correcting mechanism (for example, using shares of other correction components, such as change in the atmospheric pressure), the adjustment becomes more precise. The magnification can be adjusted at a precision that does not cause a problem in correction of ordinary expansion (or contraction) of the wafer W.

When the reference plate FP is completely aligned with the optical axis AX, the laser interferometers 120 measure the X and Y coordinates of the wafer W. The X and Y coordinates obtained by the laser interferometers 120 are used as a predetermined alignin, position and are stored in the memory.

(2) Next, the base-line measuring technique according to this embodiment will be explained. The reference plate FP is fixed to the edge of the wafer stage WST so that the top surface thereof is level with the top surface of the wafer W. The master controller 124 drives the wafer stage WST through the driving system 122 so that the reference plate FP is positioned under the optical axis AX of the projection optical system PL and under the optical axis AAX of the alignment microscope 118. In this state, the images of the reticle marks 119a, 119b of the reticle R and the wafer reference marks 115a, 115b of the reference plate FP can be observed simultaneously through the reticle microscopes 129A, 129B. (If it is immediately after the reticle alignment described above, no action is necessary because this condition has already been satisfied.)

Then, the master controller 124 adjusts (translates and rotates) the wafer stage WST so that the projected images of the reticle marks 119a and 119b are symmetrically positioned on the outer sides of the wafer reference marks 115a and 115b. In this state, the center RCT of the reticle pattern image comes into alignment with the center point between the wafer reference marks 115a and 115b of the reference plate FP.

The reference plate FP is designed so that another reference mark 115c is positioned under the alignment microscope 118. The reference mark 115c on the reference plate FP is observed based on the output from the alignment microscope 118, and an offset amount of the reference mark 115c from the designed position of the index mark within the alignment microscope 118 can be determined. Thus, the positional relationship (base-line amount BL) between the center RCT of the reticle pattern image and the alignment microscope 118 is accurately determined.

(3) Alignment exposure of a plurality of circuit patterns onto the wafer W is performed after the base-line measurement. The master controller 124 drives the wafer stage WST to a position in which the wafer alignment mark (not shown) formed on the wafer W is detected through the alignment microscope 118, as shown in FIG. 7. The master controller 124 adds the value indicating the distance between the wafer alignment mark and the index mark within the alignment microscope 118 to the output value of the laser interferometers 120. The result is regarded as the mark position. The master controller 124 then drives the wafer W (wafer stage WST) from the mark position by an amount corresponding to the sum of the base-line amount and the designed coordinates of the wafer alignment mark, based on the measurement values from the laser interferometers 120. In this manner, the projected pattern image of the reticle R is precisely aligned with the circuit pattern that has already been formed on the wafer W. The reticle R is exposed in this state to project and transfer the pattern image onto the wafer W.

Each shot area on the wafer W is successively moved to the position in which the projected reticle pattern image is formed, and exposure is repeatedly performed every time a shot area is registered in the correct position.

In the step-and-repeat type exposure operation according to this embodiment, prior to exposure, the alignment marks within a plurality of sample shot areas are detected by the alignment microscope 118. The detection results are statistically processed through, for example, the least squares method to determine the arrangement of shot areas. Then, exposure is performed based on that arrangement. This exposure method is called the EGA (enhanced global alignment) method. In general, with the EGA method, deviation from the designed value is obtained for various components (parameters), such as a shifting component, rotational component, magnification component, etc., in each shot area (each chip when performing one-shot-one-chip exposure). The driving elements 144a, 144b and 144c are regulated through the magnification correcting controller 148, based on the deviation in the magnification component, to adjust the magnification of the projection optical system PL in response to the expansion (or contraction) of the wafer W caused by the high-temperature process. Since the center RCT of the reticle image is brought into alignment with the optical axis AX of the projection optical system PL through reticle alignment in advance, alignment error does not occur even after the magnification is corrected, thereby achieving highly accurate alignment exposure.

In the EGA exposure process, the number of error parameters may be increased. For example, the degree of rotation or magnification of each shot area may be determined. By increasing the number of parameters, for example, the difference between the magnification change in the periphery and magnification change in the center of the wafer W can be obtained, and the magnification can be more precisely corrected taking into consideration the distortion of the wafer caused in that process.

The magnification may be corrected for each shot area, instead of the EGA method, although the productivity is inferior. If this is the case, TTL type alignment sensors are used, in addition to the off-axis type alignment microscope 118, to more precisely detect the magnification change in each shot area. Examples of the off-axis type alignment sensor include an LSA (laser step alignment) sensor 150 for detecting the position of the alignment mark. With the LSA sensor 150, a beam (e.g., a laser beam having a slit-like profile) is emitted horizontally through the aperture formed in the side of the reticle holder 124b. The beam is reflected by the mirror M vertically downward, passes through the projection optical system PL along the side thereof, and illuminates the wafer mark (e.g., a cross mark) on the wafer W, while scanning the wafer mark. The light beam diffracted and scattered from the alignment mark is received by the alignment sensor 150 through the projection optical system PL and the mirror M. Alternatively, the off-axis type alignment microscope 118 may be constructed by an LSA sensor 150.

It is preferable to correct a change in the magnification characteristic of the projection optical system PL itself due to, for example, a change in the atmospheric pressure.

As has been described, the positions of the wafer marks (115a, 115b), which function as reference marks for positioning the reticle R, are adjusted in advance during preadjustment of the apparatus so that the center RCT of the reticle pattern image is aligned with the optical axis AX of the projection optical system PL. To achieve this, the magnification of the projection optical system PL is changed to measure the position of the projected images of the wafer reference marks 115a, 115b before and after the magnification is changed. Then, the reticle position is adjusted prior to exposure so that the coordinates of the center RCT of the reticle image do not change even if the magnification is changed. In actual exposure, the wafer stage WST is registered in a position represented by the coordinates of the wafer stage WST obtained through the adjustment of the wafer position (the positions of the wafer reference marks 115a, 115b). The reticle is aligned with the wafer stage WST based on the wafer reference marks (115a, 115b). The center position of the reticle pattern image does not change even if the magnification of the projection optical system PL has been changed to correct the expansion (or contraction) of the wafer W during exposure. Alignment errors caused by positional shift of the pattern image of the reticle R due to a change in the magnification can be prevented.

When the wafer reference marks 115a and 115b on the reference plate FP are registered in a position in which the center RCT of the reticle pattern image and the optical axis AX align with each other in the preadjustment process, the coordinates of the wafer stage WST at that position are measured and stored. In the subsequent process, reticle alignment is performed quickly simply by referring to the position of the wafer WST, thereby improving the throughput. When aligning the reticle, the reticle marks 119a and 119b formed on the reticle R are aligned with respect to the reference marks (wafer marks in the embodiment) 115a and 115b on the reference plate FP. In this state, the wafer stage WST is registered in a position in which the projected images of the reticle marks 119a and 119b are symmetrically positioned on the outer sides of the wafer reference marks 115a and 115b, and the center between the wafer reference marks 115a and 115b on the reference plate FP is coincident with the center RCT of the reticle pattern image. Following reticle alignment, the base-line amount is measured by observing the reference mark 115c formed on the reference plate FP, based on the output from the alignment microscope 118. Thus, the process of base-line measurement is simplified, and the time taken for base-line measurement is shortened. In the embodiment, the reference plate FP is designed so that measurement of the wafer reference marks 115a and 115b through the reticle microscope 129A and 129B is performed at the same time as measurement of the wafer reference mark 115c through the alignment microscope 18. However, an ordinary reference plate that has two reference marks may be used. In such a case, the reticle marks 119a and 119b are first aligned with respect to the reference marks 115a, 115b. Then, one of the reference marks is brought under the alignment microscope 118 to position the wafer stage based on the detection standard of the alignment microscope for base-line measurement.

It has been explained that the positional shift of the reticle image due to adjustment of the magnification is mainly due to the center of the reticle R being offset from the optical axis. However, in the actual process, the reticle image also shifts due to errors in the magnification correcting mechanism. If the lens element 140 (FIG. 6) of the magnification correcting mechanism is driven obliquely with respect to the optical axis AX or slightly tilted, then the position of the reticle pattern image shifts. This phenomena cannot be separate from positional shift of the reticle pattern image due to offset of the reticle center from the optical axis AX. With the reticle alignment method of the invention, errors of these two factors can be simultaneously corrected. Assuming the error in the magnification correcting mechanism is constant, positional shift of the reticle pattern image which is caused by the error in adjustment of the magnification of the projection optical system PL through the magnification correcting mechanism, is corrected at the same time when offset of the center of the reticle R is corrected.

Although in the described embodiment, replaced reticles are aligned based on the information associated with the reference marks 115a and 115b, the invention is not limited to this arrangement. A new reticle may be registered using registration pins that define the contour of the reticle. If this is the case, the reticle is first registered in a position in which the center coordinates of the reticle image do not change, regardless of whether the magnification is changed. This position is marked by registration pins. The positions of the registration pins are stored for the later stage of reticle alignment. The point is to register reticles in the same position through alignment exposure based on the information obtained from the reticle position adjusting mechanism.

The base-line amount and the reticle position slightly change according to, for example, a change in the temperature of the apparatus. Therefore, it is preferable to measure and correct the reticle registration position at the beginning of a lot to efficiently prevent alignment errors.

Although the embodiment has been described in conjunction with an arrangement in which the mask alignment method is applied to a projection exposure apparatus of a collective exposure type, the embodiment can also be applied to a step-and-scan type exposure apparatus in which the reticle R and the wafer W are scanned relative to each other.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of projecting a pattern image formed on a mask onto a photosensitive substrate through a projection optical system having an optical axis to form a projected image thereon, the method comprising:
   (a) driving at least one of the mask and the projection optical system to change an imagery characteristic of the projection optical system;
   (b) determining a displacement amount of an image-forming position of the projected image formed through the projection optical system in accordance with a driven amount of the at least one of the mask and the projection optical system in step (a); and
   (c) correcting the displacement amount of the image-forming position of the projected image formed through the projection optical system in accordance with the driven amount of the at least one of the mask and the projection optical system so that the image-forming position of the projected image subsequent step (a) satisfies with a predetermined relation to the image-forming position of the projected image prior to step (a).

2. If the method of claim 1, wherein a memory stores a relation between the driven amount system and the displacement amount of the image-forming position, said step (b) being practiced by accessing the displacement amount stored in the memory in accordance with the driven amount.

3. The method of claim 2, wherein step (a) is practiced by driving or tilting at least one of the mask or an optical element of the projection optical system along an optical axis direction of the projection optical system or with respect to a plane perpendicular to the optical axis.

4. The method of claim 2, wherein step (a) is practiced by controlling a gas pressure in a space defined by optical elements of the projection optical system.

5. The method of claim 1, wherein step (a) is practiced by driving or tilting at least one of the mask or an optical element of the projection optical system along an optical axis direction of the projection optical system or with respect to a plane perpendicular to the optical axis.

6. The method of claim 1, wherein step (a) is practiced by controlling a gas pressure in a space defined by optical elements of the projection optical system.

7. The method of claim 1, wherein step (b) is practiced by, prior to step (a), measuring a distance between a detection center of the substrate position detector and a center of the projected image formed through the projection optical system defining a base-line amount, and after step (a), again measuring the base-line amount.

8. The method of claim 7, wherein a base-line amount measuring device for measuring the base-line amount includes a reference plate disposed adjacent and substantially level with the photosensitive substrate, the reference plate including primary alignment marks corresponding to alignment marks on the mask and a secondary alignment mark disposed adjacent the substrate position detector during initial alignment, wherein step (b) is further practiced by determining an offset amount in accordance with a distance between a center point between the primary alignment marks and the secondary alignment mark, and adding the offset amount to the base-line amount.

9. The method of claim 1, further comprising, prior to step (a) the step of (a) aligning the mask with respect to the projection optical system.

10. The method of claim 9, wherein step (d) is practiced by:
    (d1) detecting positions of projected images of at least two alignment marks formed on the mask, the alignment marks having a predetermined positional relationship with the pattern image;
    (d2) changing a magnification of the projection optical system;
    (d3) detecting the positions of the projected images after step (d2); and
    (d4) adjusting the mask position based on the positions of the projected images determined in steps (d1) and (d3).

11. The method of claim 10, further comprising the step of repeating steps (d1) through (d4) until a center of the pattern image projected onto the photosensitive substrate is aligned with the optical axis even after the magnification of the projection optical system has been changed.

12. The method of claim 10, comprising the steps of replacing the mask with a second mask and positioning the second mask in the same position as the first mask based on mask position information obtained in step (d4).

13. The method of claim 12, wherein the mask position information is a position of a reference mark corresponding to the mask position adjusted in step (d4).

14. The method of claim 12, wherein the mask position information is information supplied from a mask position adjusting mechanism during the mask adjustment performed in step (d4).

15. A mask alignment method for aligning a mask with respect to a projection optical system having an optical axis prior to transferring a pattern image of the mask onto a photosensitive substrate through the projection optical system, the method comprising:
    (a) detecting positions of projected images of at least two alignment marks formed on the mask, the alignment marks having a predetermined positional relationship with the pattern image;
    (b) changing a magnification of the projection optical system;
    (c) detecting the positions of the projected images after step (b); and
    (d) adjusting the mask position based on the positions of the projected images determined in steps (a) and (c) so that the positions of the projected images in step (b) satisfies with a predetermined relation to the positions of the projected image in step (a).

16. The method of claim 15, further comprising the step of repeating steps (a) through (d) until a center of the pattern image projected onto the photosensitive substrate is aligned with the optical axis even after the magnification of the projection optical system has been changed.

17. The method of claim 15, comprising the steps of replacing the mask with a second mask and positioning the second mask in the same position as the first mask based on mask position information obtained in step (d).

18. The method of claim 17, wherein the mask position information is a position of a reference mark corresponding to the mask position adjusted in step (d).

19. The method of claim 17, wherein the mask position information is information supplied from a mask position adjusting mechanism during the mask adjustment performed in step (d).

20. A method of projecting a pattern image formed on a mask onto a substrate through a projection optical system including a plurality of optical elements and a supporting body that supports the plurality of optical elements, the method comprising:

(a) obtaining a positional information of a relative position between one of the optical elements of the projection optical system and the supporting body; and (b) determining a positional relation between an image of the pattern image to be projected and the substrate in accordance with the positional information obtained in step (a).

21. The method of claim 20, wherein the positional information relates a displacement between one of the optical elements and the supporting member in a direction perpendicular to an axis of the projection optical system.

22. The method of claim 20, wherein the positional information relates an inclination of the one of the optical elements.

23. The method of claim 20, wherein a memory stores a relation between the positional information obtained in step (a) and a displacement amount of an image-forming position, said step (b) being practiced by accessing the displacement amount stored in the memory in accordance with the positional information.

24. The method of claim 20, wherein step (b) is practiced by, prior to step (a), measuring a distance between a detection center of the substrate position detector and a center of the projected image formed through the projection optical system defining a base-line amount, and after step (a), again measuring the base-line amount.

25. The method of claim 24, wherein a base-line amount measuring device for measuring the base-line amount includes a reference plate disposed adjacent and substantially level with the substrate, the reference plate including primary alignment marks corresponding to alignment marks on the mask and secondary alignment marks disposed adjacent the substrate position detector during initial alignment, wherein step (b) is further practiced by determining an offset amount in accordance with a distance between a center point between the primary alignment marks and the secondary alignment marks, and adding the offset amount to the base-line amount.

26. A method of projecting a pattern image formed on a mask onto a substrate through a projection optical system including at least two optical elements, the method comprising:

(a) obtaining a positional information of a relative position between a first optical element of the projection optical system and a second optical element of the projection optical system; and (b) determining a positional relation between an image of the pattern image to be projected and the substrate in accordance with the positional information obtained in step (a).

27. The method of claim 26, wherein the positional information relates a displacement between the first optical element and the second optical element in a direction perpendicular to an axis of the projection optical system.

28. The method of claim 26, wherein the positional information relates an inclination of at least one of the first optical element and the second optical element.

29. The method of claim 26, wherein a memory stores a relation between the positional information obtained in step (a) and a displacement amount of an image-forming position, said step (b) being practiced by accessing the displacement amount stored in the memory in accordance with the positional information.

30. The method of claim 26, wherein step (b) is practiced by, prior to step (a), measuring a distance between a detection center of the substrate position detector and a center of the projected image formed through the projection optical system defining a base-line amount, and after step (a), again measuring the base-line amount.

31. The method of claim 30, wherein a base-line amount measuring device for measuring the base-line amount includes a reference plate disposed adjacent and substantially level with the substrate, the reference plate including primary alignment marks corresponding to alignment marks on the mask and secondary alignment marks disposed adjacent the substrate position detector during initial alignment, wherein step (b) is further practiced by determining an offset amount in accordance with a distance between a center point between the primary alignment marks and the secondary alignment marks, and adding the offset amount to the base-line amount.

* * * * *